United States Patent
Schemmann et al.

(10) Patent No.: US 10,033,330 B2
(45) Date of Patent: Jul. 24, 2018

(54) AMPLIFIER WITH POWER DISSIPATION REDUCTION USING SINGLE RADIO FREQUENCY DIGITAL-TO-ANALOG CONVERTER

(71) Applicant: ARRIS Enterprises LLC, Suwanee, GA (US)

(72) Inventors: Marcel F. Schemmann, Maria Hoop (NL); Ido Leshem, Neve Monoson (IL)

(73) Assignee: ARRIS Enterprises LLC, Suwanne, GA (US)

( * ) Notice: Subject to any disclaimer, the term of this patent is extended or adjusted under 35 U.S.C. 154(b) by 0 days.

(21) Appl. No.: 15/387,880

(22) Filed: Dec. 22, 2016

(65) Prior Publication Data
US 2018/0183387 A1    Jun. 28, 2018

(51) Int. Cl.
| H04B 1/04 | (2006.01) |
| H03F 1/02 | (2006.01) |
| H04N 7/10 | (2006.01) |
| H03M 1/66 | (2006.01) |
| H03F 3/19 | (2006.01) |
| H03F 3/21 | (2006.01) |
| H03F 1/32 | (2006.01) |

(52) U.S. Cl.
CPC ......... *H03F 1/0205* (2013.01); *H03F 1/3247* (2013.01); *H03F 3/19* (2013.01); *H03F 3/21* (2013.01); *H03M 1/66* (2013.01); *H04N 7/102* (2013.01); *H03F 2200/102* (2013.01); *H03F 2200/451* (2013.01); *H03F 2201/3215* (2013.01)

(58) Field of Classification Search
CPC .......... H04B 1/02; H04B 1/04; H04B 1/0425; H04B 2001/0408; H04B 2001/0416; H04B 2001/0425
See application file for complete search history.

(56) References Cited

U.S. PATENT DOCUMENTS

| 8,665,018 B2 | 3/2014 | Strange et al. |
| 9,660,688 B2* | 5/2017 | Kaczman .................. H04B 1/40 |
| 2014/0199949 A1* | 7/2014 | Nagode ................. H03F 1/0227 455/73 |
| 2015/0049822 A1 | 2/2015 | Schemmann et al. |
| 2016/0099732 A1 | 4/2016 | Petrovic et al. |

FOREIGN PATENT DOCUMENTS

EP    0768765 A1    4/1997

OTHER PUBLICATIONS

PCT International Search Report & Written Opinion, Re: Application No. PCT/US2017/066947, dated Mar. 8, 2018.

* cited by examiner

*Primary Examiner* — Blane Jackson
(74) *Attorney, Agent, or Firm* — Lori Anne D. Swanson

(57) ABSTRACT

The disclosed system and method provide for a CATV power amplifier in which power dissipation may be reduced by dynamically adjusting the amplifier bias such that the bias is high only when high peak output signals need to be produced. By combining a bias control signal and an RF data signal into a single signal produced by a single DA converter, the disclosed examples require fewer DA converters and a need to synchronize DA converters to produce each of the signals individually is eliminated. A low frequency signal may be added to the RF band to find an optimum compromise between positive and negative peak excursions produced by the amplifier such that an overall reduction in bias may be achieved.

22 Claims, 13 Drawing Sheets

OVERALL HFC SYSTEM BLOCK DIAGRAM

AMPLIFIER WITH POWER DISSIPATION REDUCTION USING SINGLE RADIO FREQUENCY DIGITAL-TO-ANALOG CONVERTER

TECHNICAL FIELD

The following provides examples of radio frequency signal power amplifiers used for amplifying data signals, and the biasing of the power amplifiers to reduce power consumption by the power amplifiers.

BACKGROUND

A cable television (CATV) system is capable of providing a variety of media content, such as video, data, voice, or high-speed Internet services to subscribers. The CATV provider typically delivers the media content from a head end to its subscriber's client devices over a transmission network such as a coaxial network, a fiber optic network, or a hybrid fiber/coax (HFC) network. Requirements for data throughput (or bandwidth) in these CATV networks are growing exponentially as customers demand more content, data services, etc. Though improvements in encoding efficiencies and transport protocols have thus far allowed cable operators to keep pace with subscriber and competitive demands, it is important to continue the analysis of the various network elements that may enhance or inhibit the overall performance of next-generation cable networks.

Most of the radio frequency (RF) amplifiers within the cable television network operate in what is referred to as a "class A" mode of operation, which provides a very high fidelity signal, often quantified in terms of signal-to-noise and signal-to-2nd, 3rd, 4th, 5th . . . harmonic distortion products. However, the power consumption for the class A mode of operation is on the order of 100 times higher than the composite power of an RF output signal. This higher power consumption results from the need to accommodate significant and frequent 'peak to average' deviations from the effective signal power, which may include setting the output RF root mean square (rms) amplitude of the amplifier at no more than roughly 25% of the output rail-to-rail range of either voltage or current, depending on the implementation. The higher demand for power consumption may drive up the cost of cable network products that require RF gain blocs (e.g., head end optical transmitters and receivers, fiber-optic nodes, RF distribution amplifiers).

Amplifier power dissipation is a critical issue for high power RF amplifiers used in the cable industry. These amplifiers are typically class A amplifiers and the bias current and voltage are set to accommodate a large headroom for the RF signals. This is desirable because the peak to average power ratio of the RF signals in use is very large, on the order of 14 dB. Because a class A amplifier is biased to support the highest signals peaks, the resulting power efficiency is low, on the order of 2-5%. An approach to resolve this issue is to dynamically change the bias point of the amplifier such that the bias is high only when high signal peaks need to be output. This is particularly effective in reducing power consumption because the signal peaks in many signals occur only during a small fraction of the RF signal to be output. Thus, when the bias may be changed rapidly to a higher bias state to accommodate such peaks and then rapidly returned to a lower bias state that supports smaller signals. Using these techniques, the average amplifier bias may be reduced significantly. For instance a factor 2-3 reduction in bias may be achieved. With digital to analog (DA) converter (DAC) driven amplifiers and digital signal processing, the distortions induced by varying amplifier bias and by generally operating amplifiers at a reduced bias point may be compensated to implement a high performance RF amplifier with dynamic bias operation.

However, changing the bias of an amplifier that is amplifying an RF signal requires two signals, the RF signal and a bias signal, instead of just one RF signal as with a typical amplifier implementation. As a result, the provision of two signals requires two DAC outputs from a signal processing stage that compensates for distortion effects due to the dynamic bias operation.

Typical frequency ranges for the RF signal are 54-1200 or 108-1200 MHz. It is found that in order to obtain an effective reduction of average amplifier bias by dynamically changing the bias point the bandwidth of a "bias control signal" used to change the bias is preferably as much as 200 MHz. These bandwidths are so large that DAC timing for RF signal and bias signal becomes very critical. A DAC generating a bias signal may, for instance, operate using a 750 MHz clock rate and a DAC generating an RF signal may operate using a 3000 MHz clock rate. This puts the RF signal bandwidth and bias signal bandwidth well within the Nyquist range of the DACs. Digital signal processing is used to compensate cross-modulation products between bias signal and RF signal and RF signal distortions. Any change in mutual timing of the two DACs, however, will cause a phase shift in the distortion products and for that reason these DA converters are desirably phase locked to operate reliably as they are synchronized to a single clock cycle. This becomes clear when comparing one 750 MHz bias DAC clock cycle to 1200 MHz RF frequency; a single clock cycle shift on the bias DAC would cause a delay of more than a full signal period. Even a single 3000 MHz clock cycle on the RF DAC is still more than 120 degrees of phase shift for a 1200 MHz signal; much more than may be tolerated in a distortion cancellation scheme. In practice it is difficult to synchronize two high-speed DACs to a single clock signal and a good solution is not available that does not require an ADC monitoring path to watch over the overall system performance.

Hence, there is a need to address amplifier power consumption as well as reducing the number of components required to be supplied with power and RF signals.

SUMMARY

Disclosed is an example of a method for reducing power dissipation in an amplifier. The method includes receiving a combined digital signal at a digital-to-analog converter (DAC). The combined digital signal may have at least a digital amplifier bias control signal and a digital data signal. From combined digital signal, the DAC produces a combined analog RF signal that includes an analog radio frequency (RF) data signal in a first frequency band and an analog RF amplifier bias control signal in a second frequency band. The first frequency band is a higher frequency band than the second frequency band and the first and second frequency bands are mutually exclusive. The combined analog RF signal is output to a filter. The filter filters the combined analog RF signal to output the analog RF data signal, and to output the analog RF amplifier bias control signal. The RF data signal being configured to be applied to a signal input terminal of an RF amplifier. The analog RF amplifier bias control signal being configured to be applied to a bias control input terminal of the RF amplifier.

Also disclosed is an example of a cable television system node. The cable television system node includes a pre-amplifier stage and a plurality of power amplifiers. The pre-amplifier stage may include at least one filter. The pre-amplifier stage may also be configured to receive a combined signal including a radio frequency (RF) data signal and an RF bias control signal; filter the combined signal to separate the RF data signal from the RF bias control signal; and amplify the RF data signal to produce an amplified RF data signal. The plurality of power amplifiers may be coupled to the preamplifier stage. Each of the power amplifiers may be configured to receive the amplified RF data signal at a signal input terminal and the RF bias control signal at a bias input terminal. Each of the power amplifiers may be configured to, in response to the bias control signal being applied to a bias control input of the power amplifier, dynamically adjust an overall bias of the power amplifier while amplifying the received RF data signal.

In addition, an example of an amplification system is also disclosed. The amplification system includes a digital to analog converter and a filter stage. The digital to analog converter is coupled to receive a combined digital signal from a digital data processing stage. The combined digital signal includes a digital data signal and a digital amplifier bias control signal. A combined radio frequency (RF) signal that is an analog representation of the combined digital signal is output. The filter stage coupled to the digital to analog converter. The filter stage is configured to filter the combined RF signal to separate an analog RF data signal and an analog amplifier bias control signal from the analog combined RF signal.

BRIEF DESCRIPTION OF THE DRAWINGS

The drawing figures depict one or more implementations in accord with the present concepts, by way of example only, not by way of limitations. In the figures, like reference numerals refer to the same or similar elements.

It should be understood that, while the accompanying figures illustrate examples that include the portions of the disclosure claimed, and explain various principles and advantages of those examples, the details displayed are not necessary to understand the illustrated examples, as the details depicted in the figures would be readily apparent to those of ordinary skill in the art having the benefit of the present disclosure.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Reference now is made in detail to the examples illustrated in the accompanying drawings and discussed below.

Figure 1:
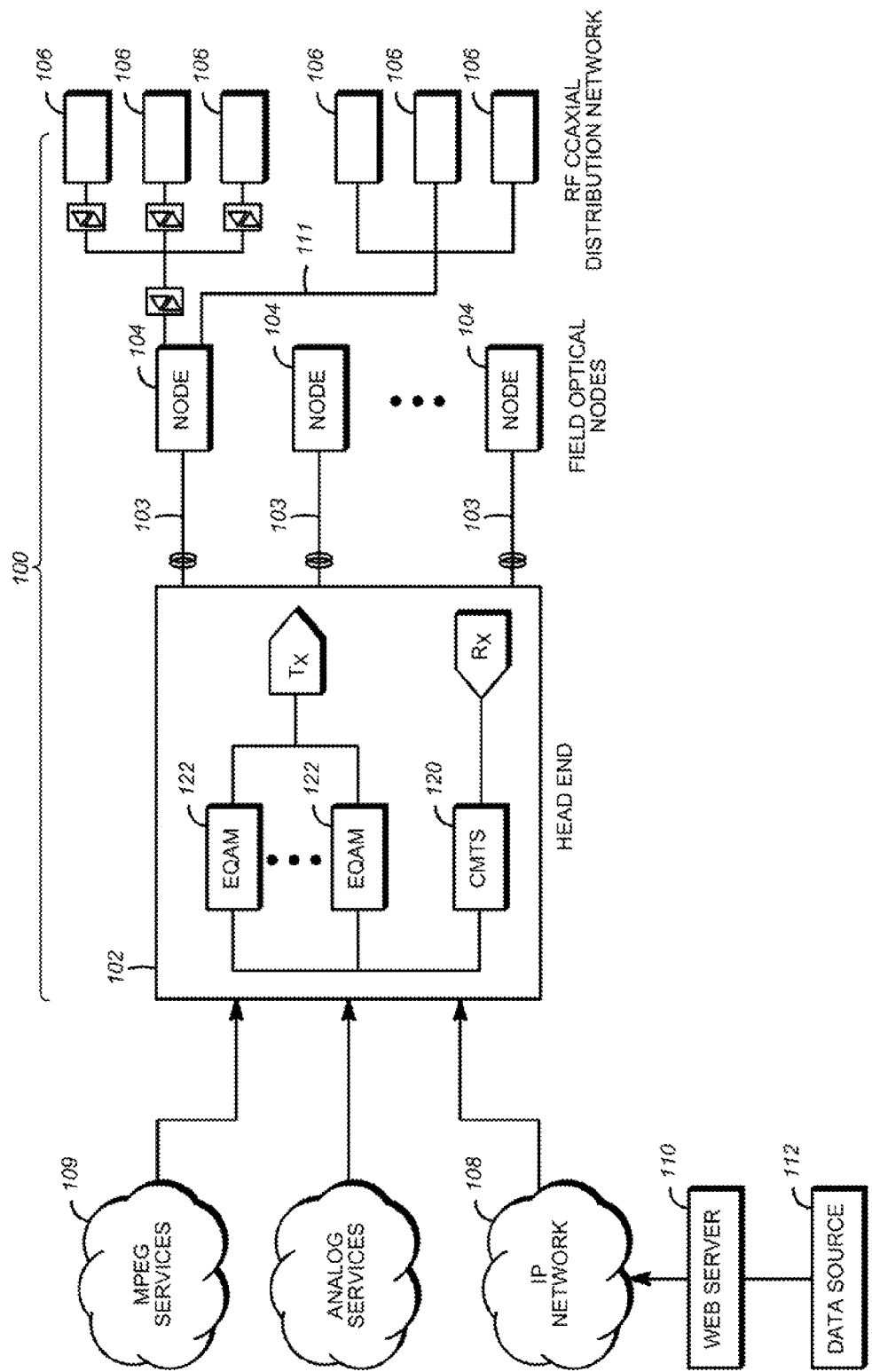
FIG. 1 illustrates an example CATV system.

FIG. 1 shows an exemplary cable television (CATV) system 100 operable to deliver high-definition digital entertainment and telecommunications such as video, voice, and high-speed Internet services. Generally speaking, the CATV system 100 refers to the operational (e.g., geographical) footprint of an entertainment and/or information services franchise that provides entertainment and/or information services to a subscriber base spanning one or more towns, a region, or a portion thereof. Particular entertainment and/or information services offered by the franchise (e.g., entertainment channel lineup, data packages, etc.) may differ from system to system. Some large cable companies operate several cable communication systems (e.g., in some cases up to hundreds of systems), and are known generally as Multiple System Operators (MSOs).

Although the system is described below in the context of a wired network that may include optical fiber elements, it is contemplated that it may also be practiced in the context of a broadband wireless system. The cable network may take the form of an all-coax, all-fiber, or hybrid fiber/coax (HFC) network, e.g., fiber to the last amplifier (FTTA). For purposes of illustration only, FIG. 1 depicts a hybrid fiber-coaxial (HFC) network. An HFC network is a broadband network that combines optical fiber and coaxial cable, strategically placing fiber nodes to provide services to a plurality of homes. It should be understood that the systems and methods disclosed in the present application may be employed in various networks and the HFC network is merely shown as a non-limiting example.

The network shown in FIG. 1 is an HFC broadband network that combines the use of optical fiber and coaxial connections. The network includes a head end 102 that receives analog video signals and digital bit streams representing different services (e.g., video, voice, and Internet) from various digital information sources. For example, the head end 102 may receive content from one or more video on demand (VOD) servers, IPTV broadcast video servers, Internet video sources, or other suitable sources for providing IP content.

An IP network 108 may include a web server 110 and a data source 112. The web server 110 is a streaming server that uses the IP protocol to deliver video-on-demand, audio-on-demand, and pay-per view streams to the IP network 108. The IP data source 112 may be connected to a regional area or backbone network (not shown) that transmits IP content. For example, the regional area network may be or include the Internet or an IP-based network, a computer network, a web-based network or other suitable wired or wireless network or network system.

At the head end 102, the various services are encoded, modulated and up-converted onto RF carriers, combined onto a single electrical signal and inserted into a broadband optical transmitter. A fiber optic network extends from the cable operator's master/regional head end 102 to a plurality of fiber optic nodes 104. The head end 102 may contain an optical transmitter or transceiver to provide optical communications through optical fibers 103. Regional head ends and/or neighborhood hub sites may also exist between the head end and one or more nodes. The fiber optic portion of the example HFC network 100 extends from the head end 102 to the regional head end/hub and/or to a plurality of nodes 104. The optical transmitter converts the electrical signal to a downstream optically modulated signal that is sent to the nodes. In turn, the optical nodes convert inbound signals to RF energy and return RF signals to optical signals along a return path. In the specification, the drawings, and the claims, the terms "forward path" and "downstream" may be interchangeably used to refer to a path from a head end to a node, a node to a subscriber, or a head end to a subscriber. Conversely, the terms "return path", "reverse path" and "upstream" may be interchangeably used to refer to a path from a subscriber to a node, a node to a head end, or a subscriber to a head end. Also, in the specification, in the drawings, and the claims a node may be any digital hub between a head end and a customer home that transports local requests over the CATV network. Forward path optical communications over the optical fiber may be converted at the nodes to Radio Frequency (RF) communications for transmission over the coaxial cable to the subscribers. Conversely, return path RF communications from the subscribers are provided over coaxial cables and are typically converted at a node to optical signals for transmission over the optical fiber to the head end. Each node 104 may contain a return path transmitter that is able to relay communications upstream from a subscriber device 106 to the head end 102.

Each node 104 serves a service group comprising one or more customer locations. By way of example, a single node 104 may be connected to thousands of cable modems or other subscriber devices 106. In an example, a fiber node may serve between one and two thousand or more customer locations. In an HFC network, the fiber optic node 104 may be connected to a plurality of subscriber devices 106 via coaxial cable cascade 111, though those of ordinary skill in the art will appreciate that the coaxial cascade may comprise a combination of RF amplifiers, taps & splitters and coaxial cable. In some implementations, each node 104 may include a broadband optical receiver (not shown) to convert the downstream optically modulated signal received from the head end or a hub to an electrical signal provided to the subscribers' devices 106 through the coaxial cascade 111. Signals may pass from the node 104 to the subscriber devices 106 via the RF cascade 111, which may be comprised of multiple amplifiers and active or passive devices including cabling, taps, splitters, and in-line equalizers. It should be understood that the amplifiers in the RF cascade 111 may be bidirectional, and may be cascaded such that an amplifier may not only feed an amplifier further along in the cascade but may also feed a large number of subscribers. The tap is the customer's drop interface to the coaxial system. Taps are designed in various values to allow amplitude consistency along the distribution system.

The subscriber devices 106 may reside at a customer location, such as a home of a cable subscriber, and are connected to the cable modem termination system (CMTS) 120 or comparable component located in a head end. A client device 106 may be a modem, e.g., cable modem, MTA (media terminal adaptor), set top box, set top gateway, terminal device, television equipped with set top box, Data Over Cable Service Interface Specification (DOCSIS) terminal device, customer premises equipment (CPE), router, or similar electronic client, end, or terminal devices of subscribers. For example, cable modems and IP set top boxes may support data connection to the Internet and other computer networks via the cable network, and the cable network provides bi-directional communication systems in which data may be sent downstream from the head end to a subscriber and upstream from a subscriber to the head end.

The techniques disclosed herein may be applied to systems compliant with DOCSIS. The cable industry developed the international Data Over Cable System Interface Specification (DOCSIS®) standard or protocol to enable the delivery of IP data packets over cable systems. In general, DOCSIS defines the communications and operations support interface requirements for a data over cable system. For example, DOCIS defines the interface requirements for cable modems involved in high-speed data distribution over cable television system networks. However, it should be understood that the techniques disclosed herein may apply to any system for digital services transmission, such as digital video or Ethernet PON over Coax (EPoc). Examples herein referring to DOCSIS are illustrative and representative of the application of the techniques to a broad range of services carried over coax.

References are made in the present disclosure to a Cable Modem Termination System (CMTS) in the head end 102. In general, the CMTS is a component located at the head end or hub site of the network that exchanges signals between the head end and client devices within the cable network infrastructure. In an example DOCSIS arrangement, for example, the CMTS and the cable modem may be the endpoints of the DOCSIS protocol, with the hybrid fiber coax (HFC) cable plant transmitting information between these endpoints. It will be appreciated that architecture 100 includes one CMTS for illustrative purposes only, as it is in fact customary that multiple CMTSs and their Cable Modems are managed through the management network.

The CMTS 120 hosts downstream and upstream ports and contains numerous receivers, each receiver handling communications between hundreds of end user network elements connected to the broadband network. For example, each CMTS 120 may be connected to several modems of many subscribers, e.g., a single CMTS may be connected to hundreds of modems that vary widely in communication characteristics. In many instances several nodes, such as fiber optic nodes 104, may serve a particular area of a town or city. DOCSIS enables IP packets to pass between devices on either side of the link between the CMTS and the cable modem.

It should be understood that the CMTS is a non-limiting example of a component in the cable network that may be used to exchange signals between the head end and subscriber devices 106 within the cable network infrastructure. For example, other non-limiting examples include a Modular CMTS (M-CMTS™) architecture or a Converged Cable Access Platform (CCAP).

An EdgeQAM (EQAM) 122 or EQAM modulator may be in the head end or hub device for receiving packets of digital content, such as video or data, re-packetizing the digital content into an MPEG transport stream, and digitally modulating the digital transport stream onto a downstream RF carrier using Quadrature Amplitude Modulation (QAM). EdgeQAMs may be used for both digital broadcast, and DOCSIS downstream transmission. In CMTS or M-CMTS implementations, data and video QAMs may be implemented on separately managed and controlled platforms. In CCAP implementations, the CMTS and edge QAM functionality may be combined in one hardware solution, thereby combining data and video delivery.

Orthogonal frequency-division multiplexing (OFDM) may utilize smaller sub-bands (compared to QAM carriers). For example, while a conventional DOCSIS QAM carrier is 6 MHz wide, the CATV system may employ orthogonal frequency division multiplexing (OFDM) technology with OFDM carriers that are approximately 25 kHz to 50 kHz wide. Thus, where previously 100 QAM carriers were used, thousands of OFDM subcarriers may be used. OFDM technology may be suitable for noisy signal conditions and may enable use of more of the available spectrum without reducing the quality of server. In example implementations, a cable network may use the QAM modulation for downstream speeds and boost upstream speeds using OFDM.

Cable television power amplifier dissipation may be reduced by dynamically adjusting the bias of such an amplifier such that the bias is high only when high peak output signals are processed. This requires two signals to operate the amplifier, a radio frequency (RF) signal and a dynamic bias control signal, typically produced by two digital to analog (DA) converters that require tight synchronization. Frequency analysis shows that good results may be achieved even when the bias control signal is limited to a frequency band less than the lower cut-off of the RF signal band. It is proposed to combine the bias control signal and the RF signal to be amplified into a single signal produced by a single DA converter and use RF filtering to separate the signals into RF and bias control signals for use by the power amplifier. This requires fewer DA converters and reduces DA converter synchronization concerns while still providing an overall bias reduction. Further analysis also shows that the lower frequency band that may be used for dynamic bias control may also be used to add a low frequency signal to the RF band to find an optimum compromise between positive and negative peak excursions produced by the amplifier such that a further overall reduction in bias may be achieved. In this case the low frequency signal is also output by the amplifier and is removed by RF filtering after the amplifier. These methods may be used on their own or in combination to reduce power amplifier power dissipation.

Analysis of the bandwidth of optimum bias control signals for CATV amplifiers shows that preferably the bias control signal bandwidth is on the order of several 100 MHz. Therefore both the RF signal to amplify and the bias control signal are wideband signals. However, further analysis shows that significant average bias reduction may already be obtained using bias signals having bandwidths up to 54 MHz or 108 MHz (for instance a factor of 2). Based on this insight, for example, the analog RF bias control signal and the analog RF data signal may be combined into one combined analog RF signal produced by a single DAC. The analog RF bias control signal and the analog RF data signal may be separated by a diplex filter at the amplifier to provide the bias signal to a bias control port of the amplifier and the RF signal to the main signal port of the amplifier. This example has the advantage that it resolves the issue of synchronization and also reduces the number of DACs and signal paths and, thus, reduces the complexity of the amplifier. For this reason, the illustrated examples combine a digital data signal and a digital bias control signal and provide the combined signal to a single DAC. The examples separate the resulting combined RF signals using RF filters. The respective RF data signal may be sent for separate amplification based on the application of the RF bias control signal to an amplifier bias input.

Because the RF bias control signal may include components having very low frequencies, the single DAC output frequency range may preferably include low frequencies, such as approximately 0-54 MHz, approximately 0-108 MHz, approximately 0-200 MHz, or the like. The RF bias control signal may be operated at a reduced signal to noise ratio since it does not directly result in an amplifier output signal. This permits outputting the RF bias control signal in the low frequency range from the DAC at a reduced signal level such that it does not needlessly consume DAC headroom (maximum headroom is typically preferred to optimize DAC performance). After separation from the combined RF signal, the RF bias control signal may be, for example, separately amplified using a low frequency amplifier.

The examples illustrate that a single DAC may be effective to produce signals for a class A amplifier that permit operation of the amplifier at a greatly reduced average bias. This may be done, for example, by adding signals to the RF signal output by the DAC such that the amplifier bias and amplified output are manipulated to avoid amplifier clipping (exceeding the peak output capability of the amplifier). It should be noted that these bias control signals may be in addition to conventional Digital Pre Distortion (DPD) that is used to add distortion compensation signals to an amplifier to obtain better linearity. The examples described herein may be used independently from or together with DPD. In some examples, when using these above described examples, DPD with added compensation of dynamic bias induced cross-modulation distortions may also be applied.

Figure 2:
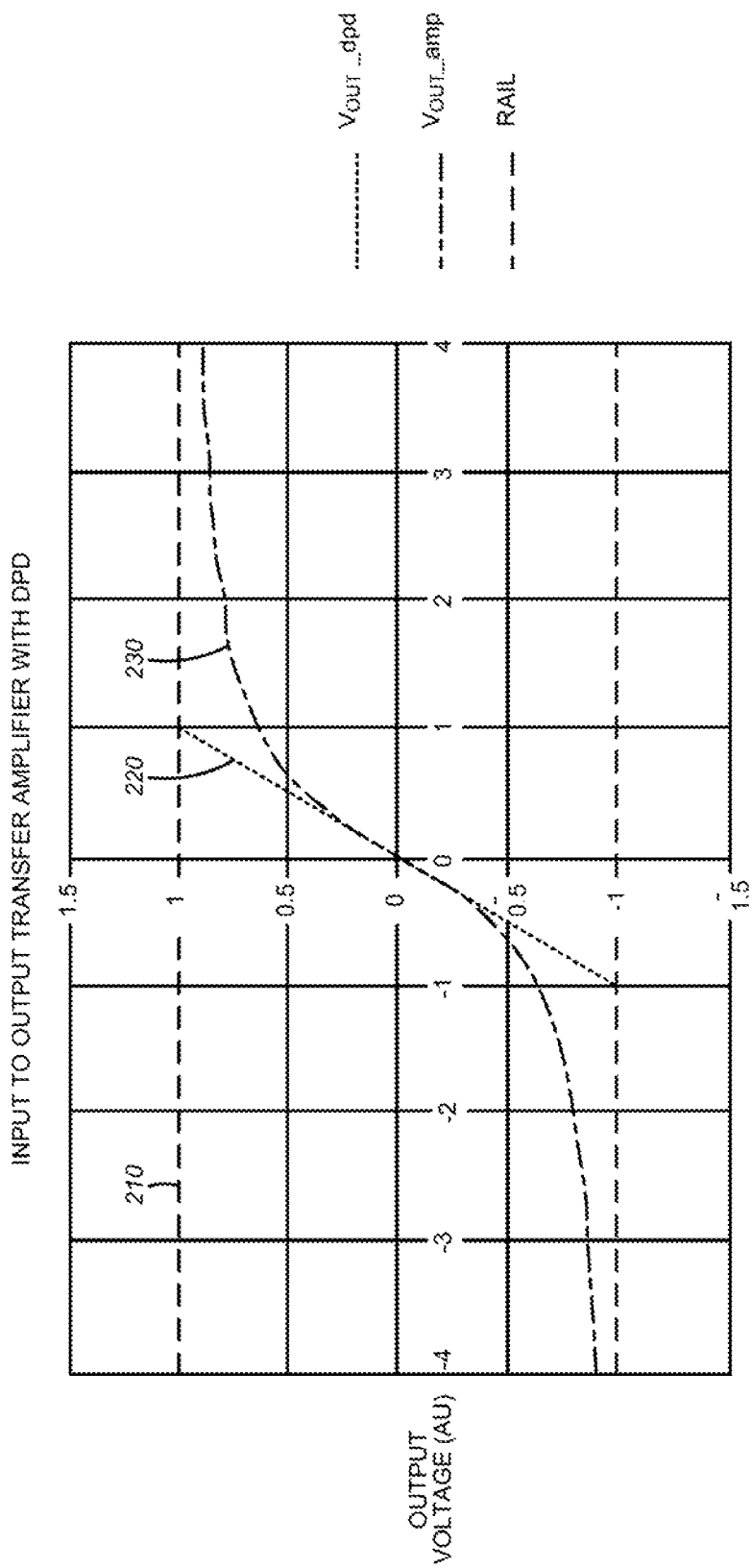
FIG. 2 is a high level diagram of an example amplifier transfer characteristic with digital predistortion applied.

FIG. 2 is a high level diagram of the transfer characteristic of an example amplifier with DPD applied system. The amplifier has a more or less ideal input to output transfer function, and the output voltage or output current that the amplifier may output is limited by, respectively, a supply voltage or supply current provided to the amplifier. This is illustrated in FIG. 2 as the dash-dot-dash lined curve, for a given input voltage a set output voltage (or current) 230 is produced but the theoretical output voltage 220 saturates for large input voltages (or currents) and approaches the supply voltage (or current) maximum (i.e., supply rails 210) shown in heavy dashed lines.

For example, when an amplifier is driven by a DA converter, Digital Pre Distortion (DPD) may be applied to modify the input signal such that the output voltage becomes a more linear function of the input voltage 220 to the extent that the amplifier is able to produce the output voltage 230 that is limited by the supply rail voltage 210. As a result of the more linear amplifier response, the amplifier may provide a better representation of large input signals, but does not necessarily increase the peak output capability of the amplifier.

In order to increase the peak output capability of an amplifier, an amplifier supply current and/or voltage rail needs to be adjusted when the amplifier needs to produce large peak output voltages. This may be accomplished by using a technique referred to as "envelope tracking" (ET) by tracking the envelope of the signal to output and increasing a bias point when the envelope of the signal to be produced is large. This technique is illustrated in the example of FIG. 3 for an amplifier that utilizes both Envelope Tracking (ET) and DPD.

A signal "envelope" may be defined as the peak amplitude values of a signal over time. A signal's "envelope" may be determined based on an analysis of the data to be transmitted. For example, a digital value representing a signal of 255 will have a different output value than a digital value representing a signal of 50. As the digital values change, the signal envelope changes a corresponding amount, by knowing the data content beforehand (by using signal delays and the like), a signal envelope may be determined using knowledge of the amplifier response to signals. Using the signal envelope, bias signals for biasing the supply power provided to the amplifier may be generated and applied to the amplifier to enable the amplifier to receive the correct supply power to amplify the input data signal.

Figure 3:
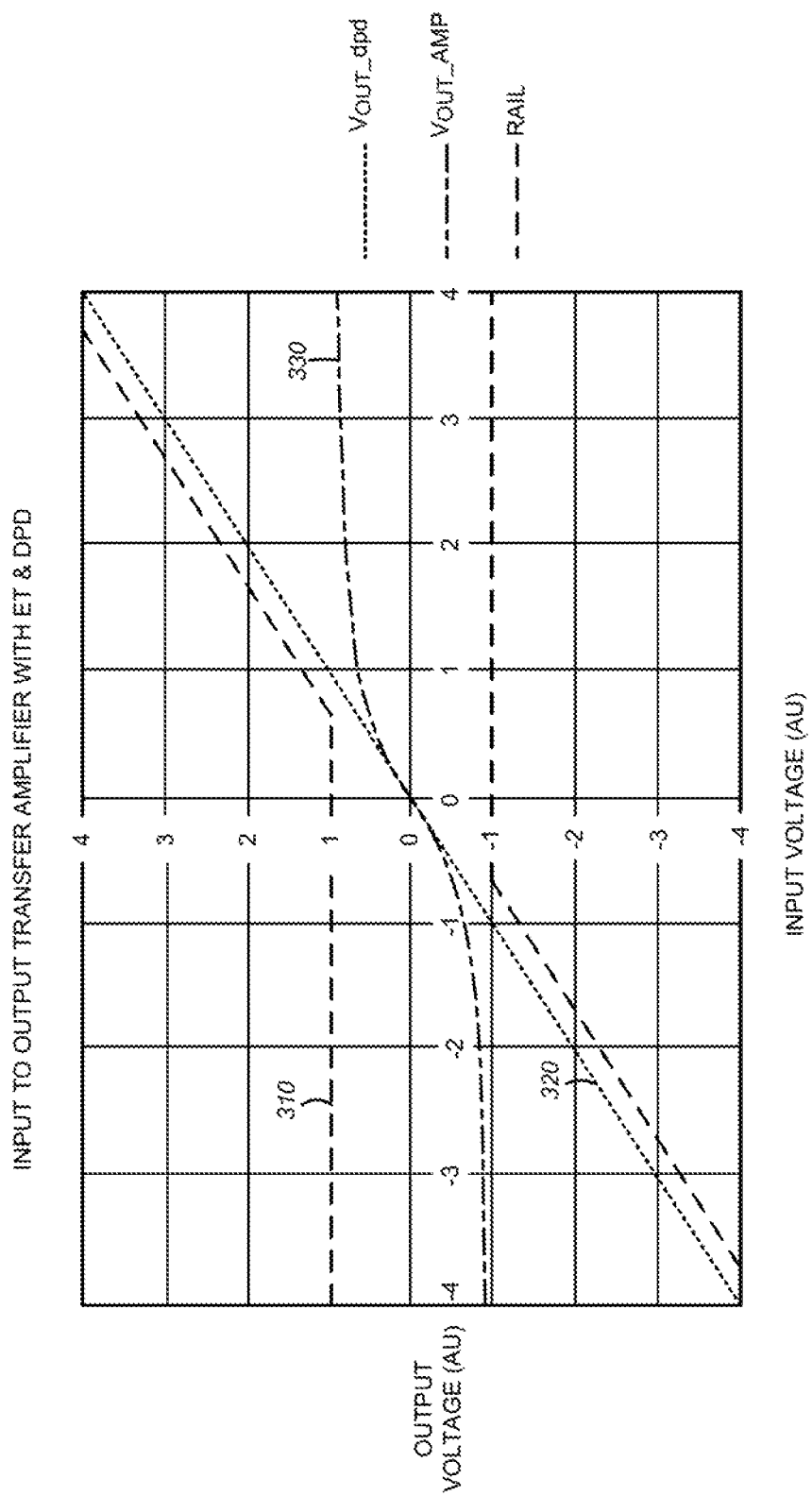
FIG. 3 is a graphical representation of an example amplifier transfer characteristic with envelope tracking and digital predistortion for use in a CATV system, such as that shown in FIG. 1.

FIG. 3 is a graphical representation of an example amplifier output with ET and DPD for use in a CATV system, such as that shown in FIG. 1.

For example, the envelope tracking signal may be used to adjust the rail voltages of the power supplied to the amplifier. As shown in the example of FIG. 3, the voltage output 330 of the amplifier may remain within the rail voltages 310 when ET (and/or PDP) is not used. However, when the input voltage is large enough such that the amplifier output would be limited by a typical amplifier bias control signal, then the bias point of the amplifier is increased by a bias control signal corresponding to an envelope tracking signal such that the amplifier may support the peak output values 320 used by the input data signal. As a result, the amplifier is no longer limited by a set (usually low) bias point but instead, the bias control is dynamically adjusted as needed to more accurately represent an output signal. For example, the output signal is less likely to be "clipped" at the boundaries of the amplifier's performance limit as set by the bias point.

As explained below with reference to later examples, the envelope signal may be generated in the digital domain by rectifying the RF signal to output (for example, by taking an absolute value of the corresponding RF signal) and generating an ET signal that tracks the RF signal to be output. However, when envelope tracking and PDP are applied to the data signal and a corresponding bias signal is generated as the input signal varies, the rail voltages and/or the zero bias point of the amplifier may be adjusted in response to the amplifier bias control signals generated based on the determined signal envelope allowing the amplifier to output a signal of sufficient power.

Figure 4A:
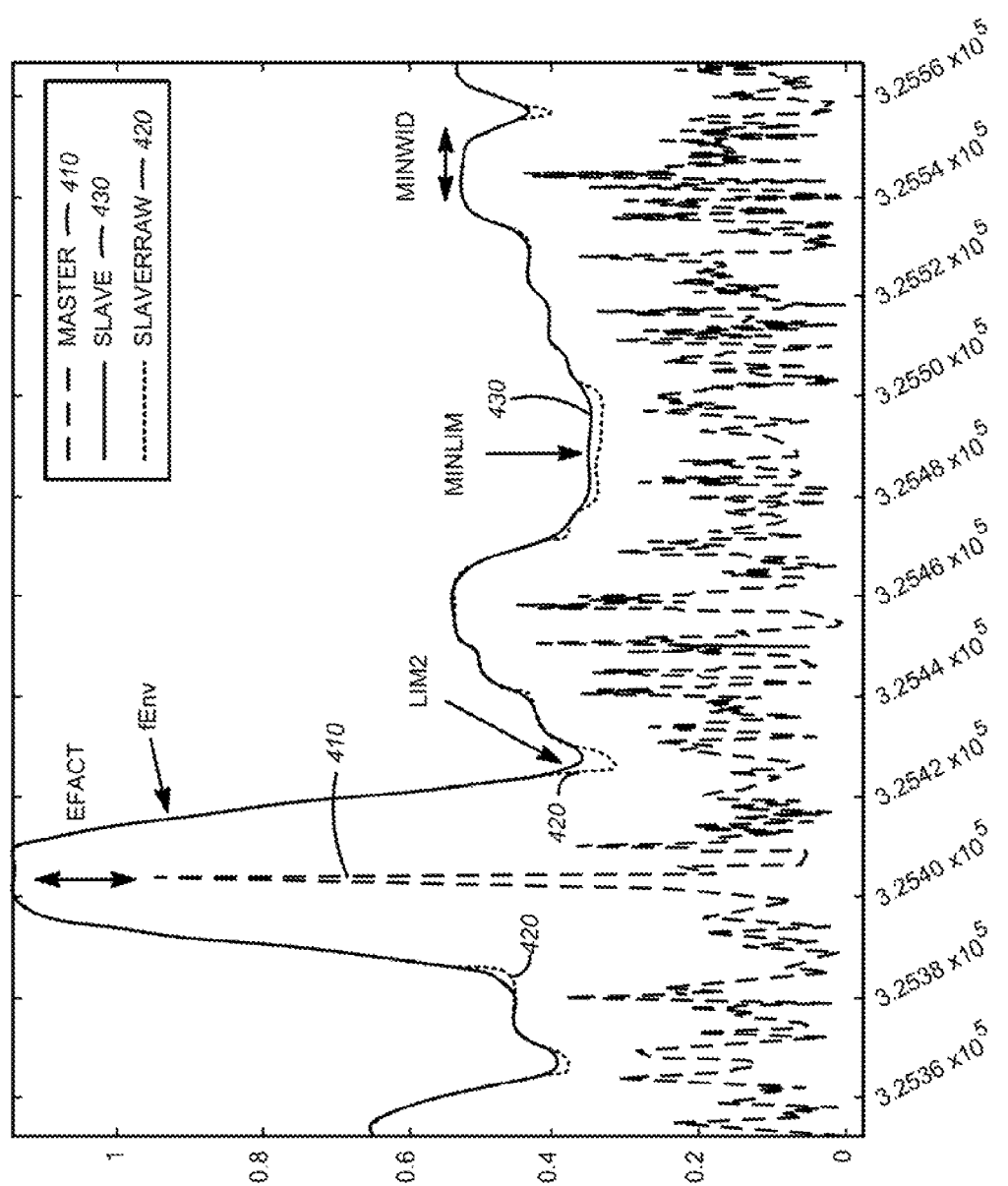
FIG. 4A is graph of signal amplitude versus time that is useful for describing envelope tracking signal generation.

FIG. 4A is a an example of ET signal generation. The small dashed line curve represents a rectified RF signal and the red and green curves represent ET signals (labeled slave). These ET signals may be used to control an amplifier bias voltage and/or current and ensure that the amplifier always has enough bias to produce the required output signal. While the peak bias may be high, the average bias is much lower than the peak value that needs to be produced.

Also note the difference between the green (slave raw) and red (slave) curves; the red curve is more "rounded" than the green curve and therefore it contains less high frequency content. An ET signal preferably obtains the best possible power dissipation reduction for the least amount of bandwidth applied. The amplifier efficiency for a typical RF signal load as used in the CATV industry was estimated as a function of bandwidth for the ET signal.

Figure 4B:
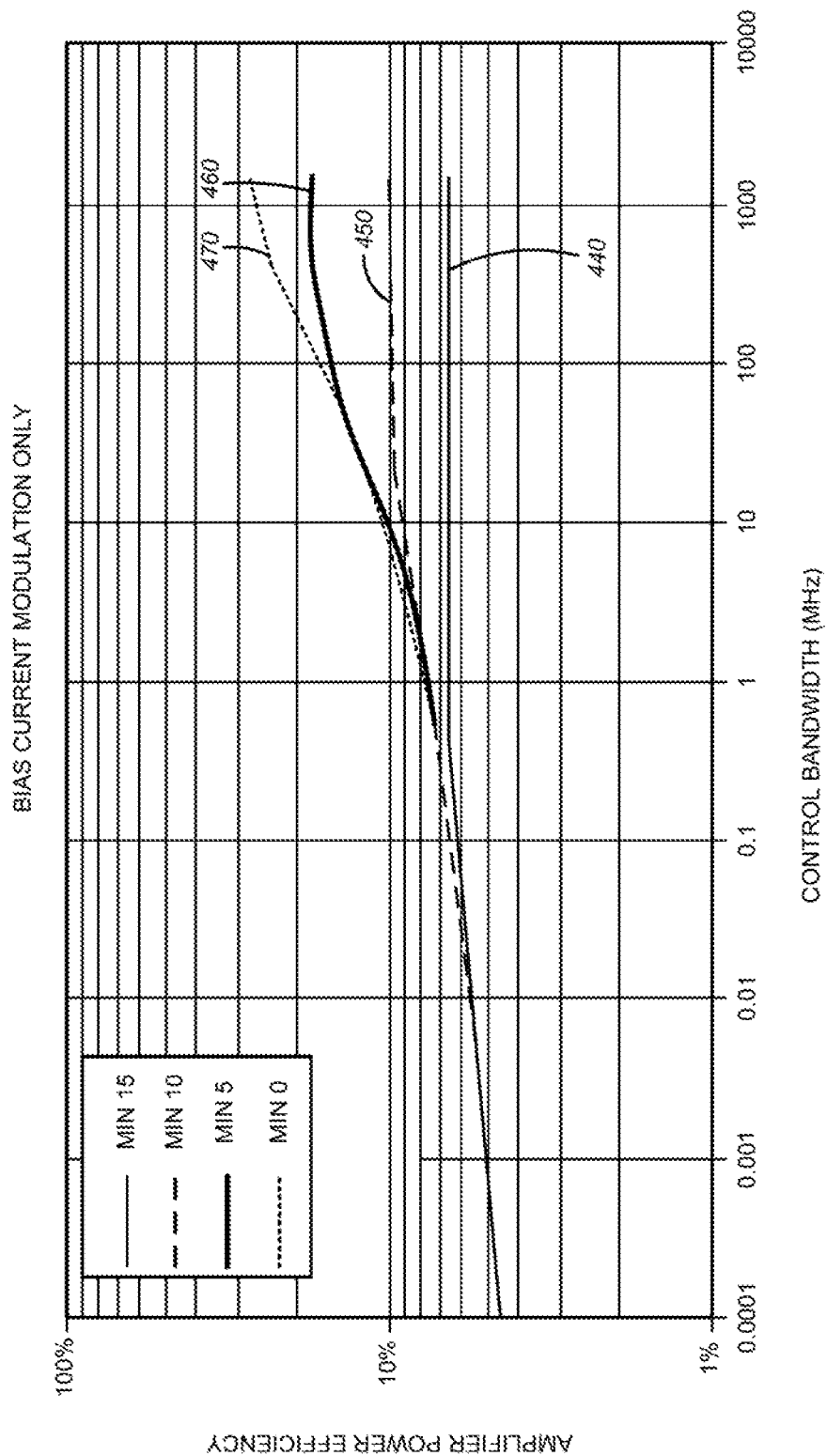
FIG. 4B is a graph of bandwidth versus bias current modulation that is useful for describing envelope tracking signal generation.
Figure 7:
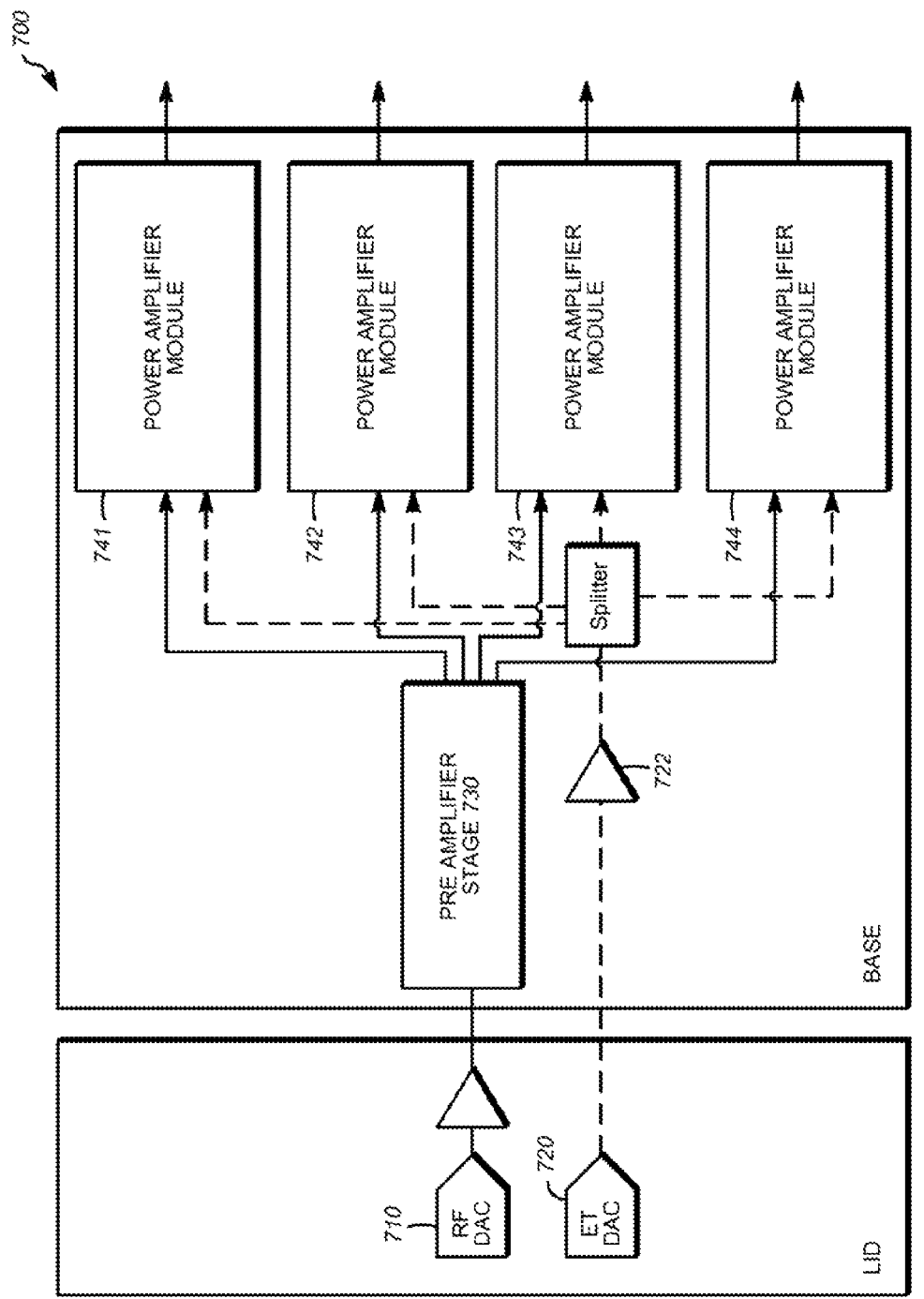
FIG. 7 illustrates a prior art illustration of a node amplification system implemented using dual DACs, one DAC for generating a radio frequency signal and another DAC for generating an envelope tracking signal.

FIG. 4B is an example chart illustrating the potential efficiency of CATV amplifier with bias current modulation as a function of ET signal bandwidth for a few different cases of ET bias variation with min 0, 5, 10 and 15 representing 0-100%, 25-100%, 50-100% and 75-100% variation respectively. An example of such a CATV amplifier is shown in FIG. 7. For example, amplifier power efficiency at very low bandwidth or without envelope tracking the efficiency is limited to approximately 5% (shown as line 440 at the left hand Y-axis intercept). However, using a higher ET signal bandwidth, the amplifier power efficiency may be improved to approximately 30% (shown as 470 for a bias control signal bandwidth of 1 GHz). However, such an improvement in amplifier power efficiency would require an envelope tracking signal that has a very large signal bandwidth that exceeds 1 GHz.

In a more specific example within bandwidths usable in the context of a cable television system implementation, a 108 MHz envelope tracking signal bandwidth is available in which the power amplifier efficiency may be improved to approximately 15%. The 15% efficiency (shown as 460 or 470) is approximately a factor of 3 improvement compared to a power amplifier without using a form of envelope tracking. For 54 MHz of envelope tracking signal bandwidth (shown as 450, 460 or 470) the efficiency may reach over 10% efficiency, which is approximately a factor of 2 improvement in power amplifier efficiency.

In prior amplifier implementations, the RF signal and envelope tracking signals are generated by two separate DA converters. For example, the input Rx data signal is provided to or generated in an FPGA, the envelope of the signal is determined and the signal is pre-distorted and provided to the amplifier via the RF DA converter 710. The envelope signal is provided to the amplifier via the ET DA converter 720 that controls a power supply and/or amplifier bias point. In a node, such as 700 of FIG. 7 with multiple output ports using this prior configuration may operate with a pair of DACs, one for the ET signal and one for the RF data signal. In which case both the ET and the RF data signals are amplified and distributed over multiple power amplifiers providing the output signals. This prior implementation requires two DA converters 710 and 720 that each operate on a separate signal path and the delay difference between the two signal paths must be held constant. Keeping this delay constant for the high speed DA converters requires synchronization to a single DA converter clock cycle which is not a trivial task.

Figure 5:
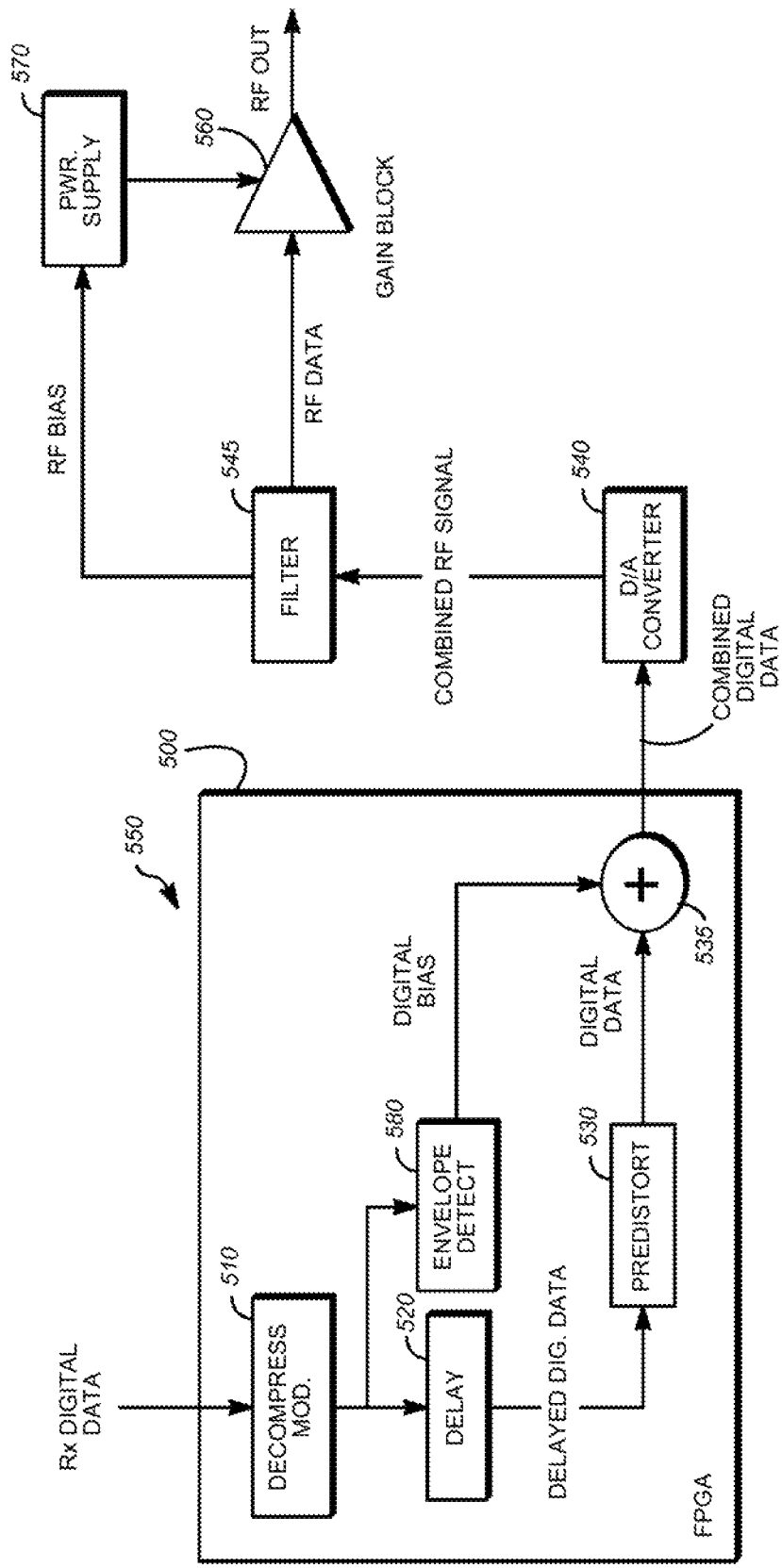
FIG. 5 illustrates an example of an amplification system with envelope tracking signal.

FIG. 5 is a block diagram of an example RF amplifier system with an envelope tracking signal with a single DAC system that provides the performance illustrated in the examples described with reference to FIGS. 1-4.

The amplifier system 550 is capable of being used in a cable television system node, such as node 104, to modulate an amplifier power supply so as to efficiently attain amplified RF signal output power with a lower power dissipation than previous amplifiers. The amplifier system 550 includes a receiver 500, a combiner 535 implemented in digital signal processing, a digital to analog converter (DAC) 540, a filter 545, a power supply 570 and a gain block 560.

The receiver 500 may include a number of components. For example, the receiver 500 may include a decompression or signal generation module 510, a compensating delay element 520, an envelope detector 580 and an optional predistortion circuit 530. The receiver 500 may output signals from the envelope detector 580 and the delay 520. In examples that include the optional predistortion circuit 530, the output will be from the predistortion circuit 530 instead of the delay 520. The output signals from the receiver 500 may be, for example, a digital bias signal (from the envelope detector 580) and a digital data signal (from the delay 520 or predistortion circuit 530). In some examples, the optional predistortion circuit 530, may be present and be selectable. For example, the selection of whether predistortion will be added to the digital data may be based on application of a control signal, based on a determined type of data more susceptible to amplifier distortion or the like.

In operation, the receiver 500 obtains digital data by either generating the data or receiving the data from a source, such as a content server, media source or the like. The data, if compressed, is decompressed by the decompression module 510. The receiver 500 generates a digital signal. Prior to amplifying the decompressed data, the receiver 500 introduces a delay 520 before processing the signal by an optional pre-distortion module 530. The digital data signal is output from the receiver 500 and input to the combiner 535.

The delay 520 compensates the timing of the digital signal to match the timing of the ET signal derived from the digital signal. The receiver 500 preferably includes an envelope detector 580 that analyzes the decompressed digital data, i.e. the same data that will converted to the input data signal applied to the amplifier 350, and uses the data to create a bias control signal to the power supply 570 through DA converter 390. The bias control signal (which indicates the envelope of the RF data signal to be amplified) may comprise any one of a number of alternate forms. For example, in a simple example, the power supply 570 may be modulated in a binary manner between a normal (low) bias point used during the periods when the signal is not experiencing signal peaks and a peak (high) bias point when the signal is experiencing signal peaks. Because of the delay 520, the bias point of the amplifier 550 may be modulated in a synchronous manner with the signal being amplified so that the bias point is raised as the signal reaches a peak and is lowered as the signal falls from the peak.

In other examples, more complicated modulation schemes may be employed, such as switching the bias between more than two bias points to account for variances in the amplitudes among signal peaks, or even modulating the bias control voltage or current of the power amplifier in a manner that is linear with respect to the signal amplitude at any point in time. It should be understood that the delay 520 may be introduced at any time before amplifying the data so that the amplified data coincides with the bias control signal, and that the illustration of the delay occurring after decompression is illustrative only, particularly given that some systems may not include compressed data, or otherwise need to decompress data for amplification.

The envelope detector 580, for example, may detect both positive and negative peaks, and may calculate the absolute value of a representation of the RF signal to be amplified before performing a peak detection or power detection operation. The amount of delay 520 is set such that the bias signal, after filtering by filter 545, may reach a peak value concurrently with a peak in the RF data signal to be amplified by the gain block 560 as will now be described in more detail.

The envelope detector 580 outputs a digital bias control signal to the combiner 535. The combiner 535 and the digital data are combined to form a combined digital data signal. The combined digital data signal is applied to the DA converter (DAC) 540. The DAC 540 is configured to output signals in a frequency band below the lower cut-off frequency of the CATV frequency band. This means that in addition to outputting the RF data signal, the RF bias signal (which indicates the envelope of the RF data signal to be amplified) may be output by the RF DAC in a frequency band below the CATV downstream frequency band of 54-1200 or 108-1200 MHz. For example, the bias control signal may be in the frequency range of approximately 0-54 MHz, 0-108, or 0-200 MHz including any guard bands. This means that both the RF downstream signal and the RF bias control signal (i.e., envelope tracking) signal may be produced by a single DAC 540 and later separated by RF filter(s) 545 to produce separate RF bias control signals and RF data signals. The RF bias control signals are applied to the input of the power supply 570 which in turn supplies power to the gain block 560. The RF data signal is applied to the gain block 560. The gain block 560 amplifies the RF data signal within the power limits supplied by the power supply 570. As a result, power is not wasted as the power supply 570 supplies power as needed to accommodate the fluctuations of the input RF data signal.

As may be appreciated by those of ordinary skill in the art, the receiver 500 may use signal processing to predict power envelopes and automatically compensate for amplifier artifacts due to power supply modulation by generating a power supply modulation compensation signal in the output DA converter. The bias point of the amplifier (current and/or voltage) may be controlled by application of the bias control signal to reduce amplifier dissipation. In some examples, the receiver 500 may, on average, dissipate approximately 4 times less supply power for a given output power level. Less power used by the receiver 500 enables the use of smaller transistors, a smaller heat-sink, lower cost packaging, and a reduction of the node size and power consumption.

It should be noted that while examples disclosed herein describe a node amplifier solution for power reduction, the concepts apply for other amplifiers in the cable network. For example, amplifier examples may incorporate bias control of analog amplifiers cascaded in the field that may not be driven directly by DACs. In an amplifier in the cascade of amplifiers, lower cost amplifiers are desirable. As disclosed, examples for the cascaded amplifier may allow use of a lower cost amplifier via the reduction of the average power dissipation with a higher output power capability as an option. Where the cable network has been upgraded, lower cost amplifiers that reduce power dissipation but accommodate brief high-power output signals are desirable.

The disclosed digital forward architecture permits very low cost and power efficient nodes. For example, the disclosed digital forward techniques allow low cost and power efficient node designs that enable node replacement and also fiber deep architectures that are currently inhibited by node cost and by maximum wavelength counts on fiber. Furthermore, in examples where all processing is in the digital domain, there is flexibility in the band-split of such a design. Almost any RF gain stage may benefit from the disclosed techniques where a digitized input signal is made, delayed, and used as a decision input for a power supply and predistortion input. Existing standard HFC gain stages do not have a benefit of the digitized signal, thus the disclosed digital forward (and digital return) systems disclosed may benefit from the disclosed techniques for the receiving side of the system and the corresponding output RF gain stage (with a cost effective, minimal functional blocks/cost addition).

It should be noted that various implementations for the disclosed techniques are possible wherein the supply voltage and/or the transistor bias are modulated. In a push-pull output stage, for example, the push and pull transistors may be independently driven by DA converters to permit true class B operation or class B operation combined with supply modulation. Such manipulations may cause distortions in analog the output signal; however the distortions are predictable. The digital predistort 530 in the receiver 500 may optionally be used to mitigate the distortions.

Figure 6:
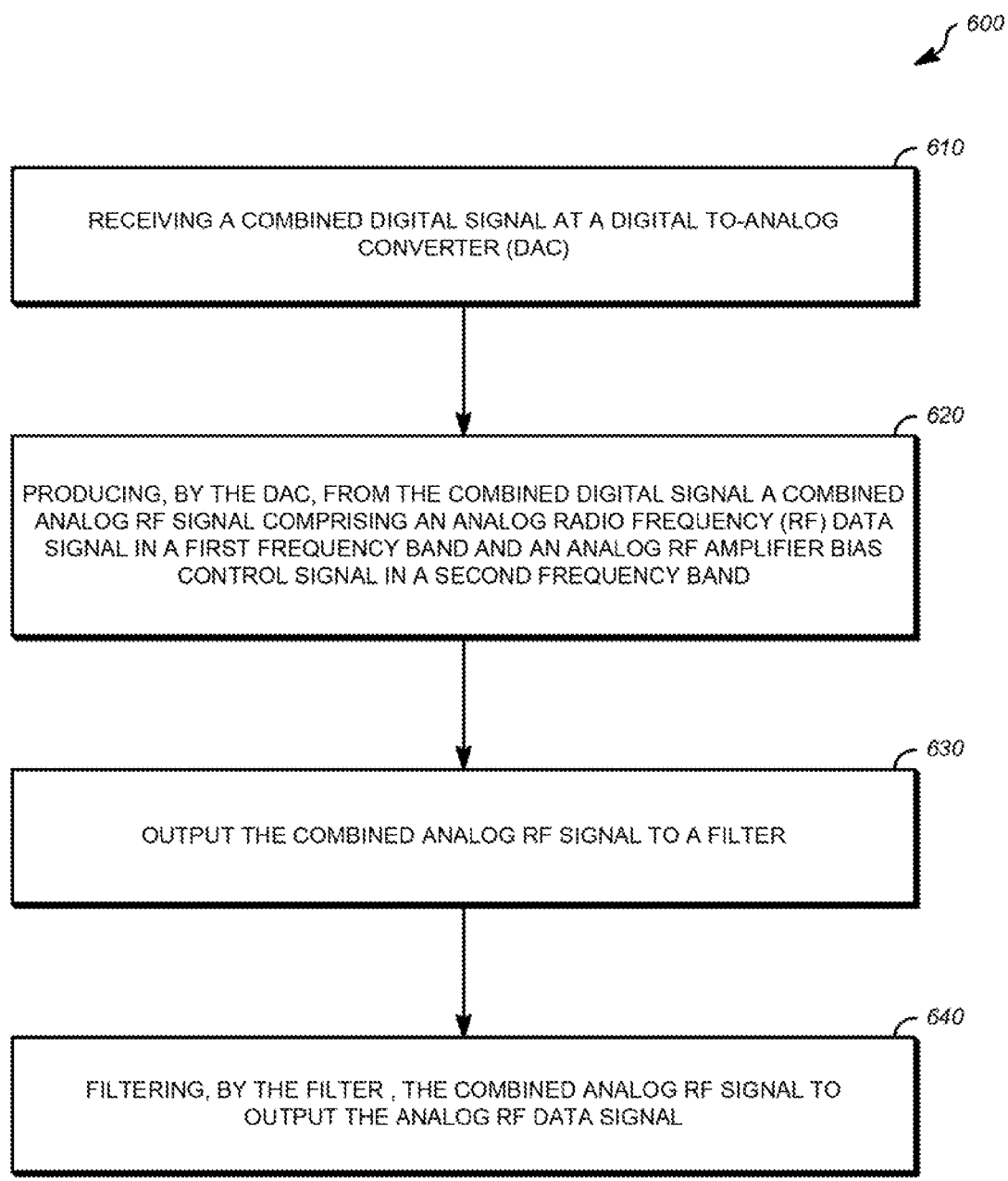
FIG. 6 is a flowchart of an example of a process for implementing a single digital to analog converter such as that shown in the example of FIG. 5.

It may be appropriate at this time to provide an example of a method for improving the power amplifier efficiency that takes advantage of the foregoing observations. FIG. 6 is a flowchart of an example method for providing a bias control signal to effect the improved amplifier efficiency described above. The process 600 includes at block 610 receiving a combined digital signal at a digital-to-analog converter (DAC), such as DAC 540 in FIG. 5. The combined digital signal may include a digital amplifier bias control signal and a digital data signal.

The DAC 540, as discussed with reference to FIG. 5, produces, at block 620, a combined digital signal that includes an analog radio frequency (RF) data signal in a first frequency band and an analog RF amplifier bias control signal in a second frequency band. In an example, the first frequency band is a higher frequency band, such as 54-1200 MHz or 108-1200 MHz, than the second frequency band, such as 0-54 MHz or 0-108 MHz. In this example, the first and second radio frequency bands are mutually exclusive. At block 630, the DAC outputs the combined analog RF signal. The combined RF signal is applied to at least one RF filter coupled to the RF amplifier. The at least one RF filter is configured to produce an RF data signal in the first radio frequency band and an RF amplifier bias control signal in the second radio frequency band.

For example, the first radio frequency band for the RF data signal may be, for example, approximately 54-1200 MHz, approximately 108-1200 MHz, or 200-1200 MHz and the second radio frequency band for the RF amplifier bias control signal may be, for example, approximately 0-54 MHz, approximately 0-108 MHz or approximately 0-200 MHz including any guard band. In some examples, a guard band between the first frequency band and the second frequency band, having a bandwidth of 500 kHz to 5 MHz, may be included to avoid interference with other signaling that may also be utilizing bandwidth within the first or second frequency bands. For example, the second frequency band occupied by the bias control signal may also be the band that is used for networking (e.g. Data Over Cable Service Interface Specification (DOCSIS™)). As a result, the RF filter is configured to remove, or allow to pass, the RF bias control signal needs so that it does not interfere with the networking signals. The RF filter configuration may take into account any guard band within the second frequency band of approximately 500 kHz. Of course, narrower or broader guard bands may be used depending upon filter configurations, network signaling or data signaling requirements.

The filter, at block 640, filters the combined analog RF signal to output the analog RF data signal. The RF data signal output from the DAC is configured to be applied to a signal input terminal of an RF amplifier, and the analog RF amplifier bias control signal may be configured to be applied to a bias control input terminal of a power supply of the RF amplifier.

The at least one RF filter, for example, may be configured to separate at least part of the bias control signal filtered from the second frequency band of the combined RF signal. Upon output from the at least one RF filter, the separated bias control signal may be applied to a bias input of the RF amplifier via a separate path. A benefit of generating the bias control signal as described herein is to modulate a bias point of the RF amplifier according to the signal envelope of the signal to be amplified thereby eliminating a need for supplying a constant amount of power to accommodate any peaks (positive or negative) in the RF data signal to be amplified. As described in the foregoing examples, the an overall amplifier bias of the RF power amplifier may be dynamically adjusted according to the RF amplifier bias control signal, and as a result the amplifier bias control signal may track an envelope of the data signal in the high radio frequency band.

Prior to the DAC receiving the combined digital signal, the digital signal may be pre-processed to provide the digital data signal and the digital bias that are combined to form the combined digital signal. For example, the digital data signal is delayed to allow the peak amplitude to be measured and to generate an envelope signal that has the same timing as the digital data signal. In addition, the delayed digital data may have digital predistortion applied to signal to reduce amplifier distortion by the RF amplifier. Signal predistortion may be applied only to the RF data signal, not to the bias control signal. In addition, or alternatively, to the signal predistortion, a digital compensation signal may be applied to the digital data signal to compensate for dynamic bias induced distortion to the delayed digital data signal.

FIG. 7 illustrates a prior art illustration of a node amplifier having both a RF signal DAC and ET signal DAC. In this implementation, the node 700 utilizes a pair of digital to analog conversion (DAC) devices are 710 and 720. The DAC 710 coverts the digital data signal to an analog RF signal that provided to the preamplifier stage 730. The pre amplifier stage 730 provides some amplification and distributes the pre-amplified RF data signal to each of the power amplifiers 741-744 in the node 700 for distribution. In addition, a digitized envelope tracking signal may be provided to the envelope tracking DAC 720. The signal output from the envelope tracking (ET) DAC 720 may be amplified by, for example, amplifier 722. The ET DAC 720 may output a bias control to the power amplifiers 741-745. While only power amplifiers 741-744 are shown for ease of discussion, more or fewer power amplifiers may be included in the node 700. However, the prior art implementation of FIG. 7 utilizes two DACs and does not provide the benefits described above or as described in the following discussion of FIG. 8.

Figure 8:
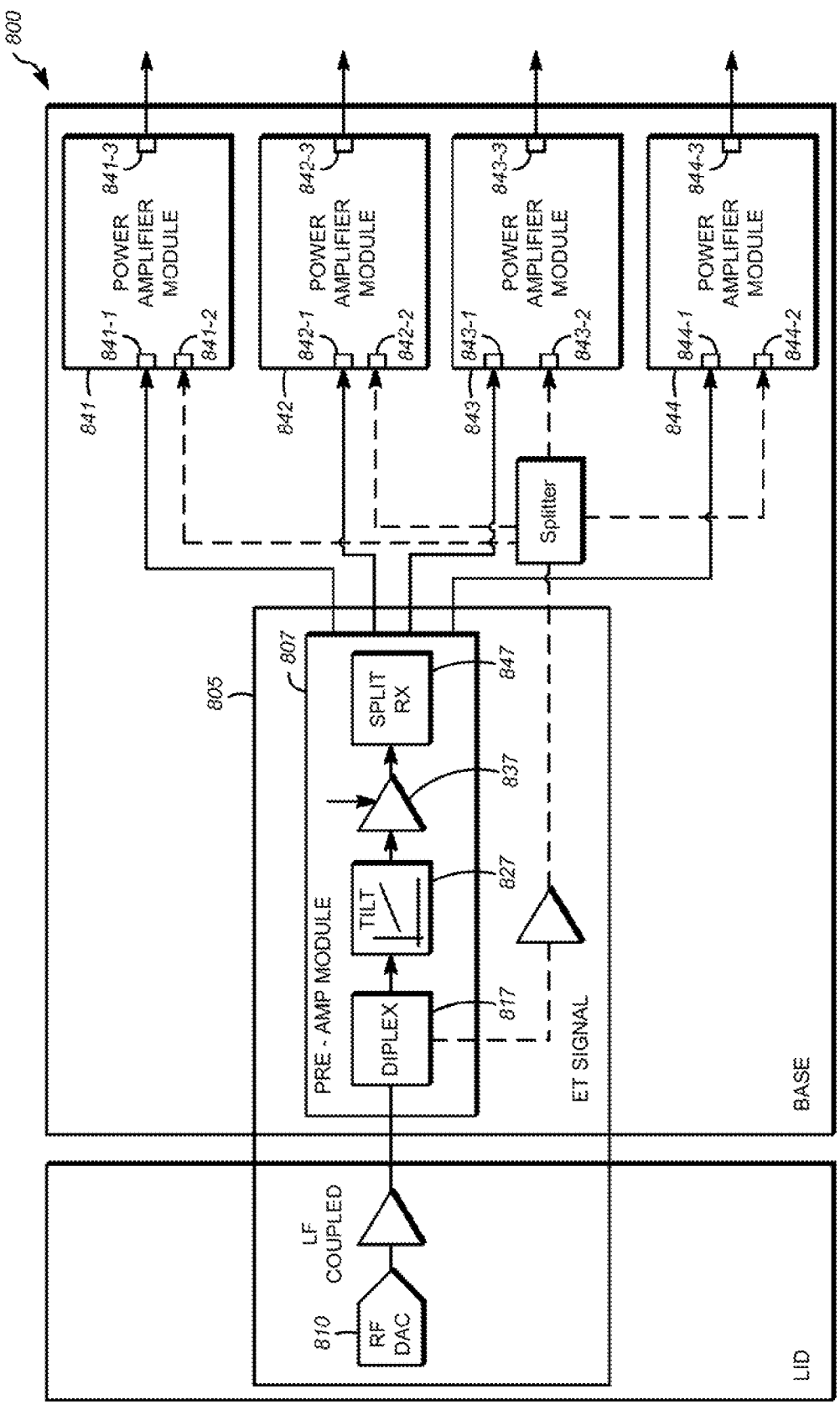
FIG. 8 illustrates a cable television system node incorporating an amplification system as described with reference to the examples of FIG. 1-6.

FIG. 8 illustrates a cable television system node incorporating an amplification system as described with reference to the examples of FIG. 1-6.

The node 800 may include an amplification system 805 and power amplifiers 841-844. The amplification system 805 may include a digital to analog converter 810 and a pre-amplifier stage 807.

In general, a single DAC 810 outputs an RF data signal and an RF bias control signal (i.e., an ET signal), these signals are separated by a diplex filter prior to the RF signal being amplified by the RF pre-amplifier. The bias control signal is provided via a separate path to control the bias point of the output power amplifiers.

In more detail, the digital to analog converter (DAC) 810 is coupled to receive a combined digital signal from a digital data processing stage, such as receiver 500 in FIG. 5. The combined digital signal may include at least a digital data signal and a digital amplifier bias control signal. The DAC 810 may output a combined radio frequency (RF) signal that is an analog RF representation of the combined digital signal to the pre-amplifier stage 807.

In this example, the DAC 810 is coupled to the pre-amplifier stage 807 and its components. For example, the pre-amplifier stage 807 may include an RF filter stage 817 that has at least one RF filter, a tilt compensation circuit 827, a pre-amplifier 837 and a splitter 847. In the example, the RF filter 817 separates the RF data signal from the ET signal and provides the signals at separate output terminals. The pre-amplifier stage 807, in this example, is configured to receive the combined RF signal that includes at least the radio frequency (RF) data signal and the RF bias control signal. The pre-amplifier stage 807 is also configured to filter via the filter stage 817 the RF data signal and/or the RF bias control signal from the combined RF signal.

As mentioned above, the input of filter stage 817 is coupled to the digital to analog converter 810, the filter stage 817 filters the combined RF signal to separate the RF data signal from the amplifier bias control signal. In more detail, the filter stage 817 may include a first filter (not shown) that passes a first frequency band that includes frequencies between approximately 54-1200 MHz and a second filter (not shown) that passes a second frequency band that includes frequencies between approximately 0-54 MHz minus any guard band. Of course, the filter stage 817 may include other filters that further filter narrow bandwidths within each of the first frequency band and the second frequency band, or even frequencies outside either the first or second frequency bands. Alternatively the first frequency band may be approximately 108-1200 and the second frequency band may be approximately 0-108 MHz minus any guard band. In another alternative, the first frequency band may be approximately 200-1200 and the second frequency band may be approximately 0-200 MHz minus any guard band. In this example, the at least one RF filter may be a diplex filter that removes the RF bias control signal from the combined signal provided to the pre-amplifier stage 807. Continuing with this example, the diplex filters may be configured to reject the lower frequency bias control signals present in the combined RF signals.

Generally, amplifiers, such as video signal amplifiers, amplify lower frequency signals within the first frequency band (e.g., 54-1200 MHz or 108-1200 MHz) as much as higher frequency signals within the same frequency band. However in a coaxial cable network cable transmission loss is much higher at high frequency than at low frequency. In order to compensate for this possible unequal signal level in a coaxial cable plant, a tilt compensator 827 may be incorporated into the pre-amplifier stage 807 to compensate the video signals within the RF data signal in order to bring the frequency profile of the signal back into alignment. The tilt compensator 827 may be coupled to an amplifier 837 to boost the RF data signal strength by amplifying the RF data signal output from the tilt compensator 827. A pre-amplified RF data signal output from amplifier 837 may be applied to a splitter 847 that delivers the pre-amplified RF data signal to the power amplifiers 841-844 for further amplification.

The node 800 may also include a plurality of power amplifiers 841-844. While only power amplifiers 841-844 are shown for ease of discussion, more or fewer power amplifiers may be included in the node 800. The pre-amplifier stage 807 may be configured to provide a signal including a radio frequency (RF) data signal and an RF bias control signal for application to the power amplifiers 841-844. After filtering the respective first and second frequency bands, the filter stage 817 outputs the RF data signal in the first frequency band to the signal input terminal of the power amplifier and outputs the amplifier bias control (ET) signal in the second frequency band to the amplifier bias control input terminal of the power amplifier, such as 841 of the plurality of power amplifiers 841-844.

In this example, each of the power amplifiers 841-844 is coupled to the filter 817, for example, via the outputs from the pre-amplifier stage 807. Each power amplifier 841-844 also has an RF data signal input terminal 841-1 to 844-1, an amplifier bias control input terminal 841-2 to 844-2, and output terminal 841-3 to 844-3, respectively. As such, each of the power amplifiers 841-844 may be configured to separately receive the RF data signal at a signal input terminal 841-1 to 844-1 and the RF bias control signal at a bias input terminal 841-2 to 844-2.

The amplifier bias control signal output from the filter stage 817 may be provided via a separate path from the RF data signal the power amplifier 841-844. For example, each of the power amplifiers 841-844 may be configured to, in response to the bias control signal being applied to a bias control input 841-2 to 844-2 of the respective power amplifier 841-844, dynamically adjust an overall bias of the respective power amplifier 841-844.

Not shown in the example of FIG. 8 are the elements described above with respect to FIG. 5 that may also be included at the node 800. For example, the amplification stage 805 may also include prior to the DAC 810, a predistortion module configured to introduce a predistortion to the RF data signal to compensate for amplifier distortion of the RF data signal. The predistortion module may be further configured to introduce a dynamic bias compensation to compensate for dynamic bias induced distortion of the RF data signal.

In addition, the amplification system may include a source for receiving or generating a digital data signal; a delay element coupled to the source, and a combiner. As discussed previously, the delay element is configured to delay the digital data signal to compensate for the time used to generate the ET signal. The signal envelope determination module may be coupled to the source. The signal envelope determination module may be configured to generate a digital amplifier bias control signal representing an envelope of the digital data. Similarly, the combiner is coupled to the delay element. The amplification system may also include a digital predistortion module coupled the delay element and the combiner. The digital predistortion module may be configured to predistort the digital data to compensate for distortion introduced by the power amplifier. The amplification system may also include a decompression element coupled to the source. The decompression element is configured to decompress, if needed, digital data obtained from the source. The decompressed digital data is output to the delay element and the signal envelope determination module.

The ET signal frequency analysis described with reference to FIGS. 3, 4A and 4B shows that the ET signal may be limited to a frequency band that is below the lower cut-off of the CATV frequency band. As described in the earlier examples, in addition to the RF signal, the ET signal may be output by a single DAC in a frequency band below the CATV downstream frequency band of 54-1200 or 108-1200 MHz.

The single DAC used to output an RF signal may also be considered to output a low frequency signal that is not a bias control signal. For example, a single DAC may be used output a low-frequency analog signal that, when added to the signal applied to the signal input terminal of an RF amplifier, adjusts the relative positive and negative excursions of the signal without adjusting the amplifier bias. This signal may provide a significant power reduction as compared to previous systems. The single DAC produces an output signal containing bias control information in the low frequency range and an RF signal to be amplified, where these signals are separated by RF filters before the power amplifier. The separation may have a finite cross-over bandwidth (e.g. a guard band); in principle this bandwidth may be wasted because it is not used in a meaningful way. However, the single DAC example as described herein may be further optimized by using this cross-over range. It should be noted that signals in the cross-over range partly result in bias modulation and partly result in unintended low frequency RF output signals. In systems where the RF amplifier is followed by a diplex filter, removing low frequency signals with sufficient suppression may allow the inclusion of a low frequency bias control signal and the low frequency RF output signal. In such examples where signal peaks are isolated positive or negative excursions, a low frequency signal within the RF signal to be amplified may be used to adjust the RF signal to be more negative in anticipation of a positive signal peak or more positive in anticipation of a negative signal peak such that the peak level does not exceed the amplifier peak output capability (i.e., the output signal is not "clipped") for a fixed or limited-range bias control signal. When positive and negative peaks do not occur in rapid succession then even a low frequency signal in the RF signal to be amplified may be sufficient to keep the signal within the amplifier output peak capability. Therefore adding such a low frequency component to the RF signal to be amplified may also be effective at fitting the signal within an amplifier peak output capability such that, for instance, the amplifier may be designed with a lower peak capability for a given signal and/or application. Examples of inclusion of a low frequency component to the RF signal are described with reference to FIGS. 9-11.

As discussed above, additional RF signals in the frequency band below the RF signal frequency cut-off may be used to output an ET signal as was shown in FIGS. 4A and 4B. However, a part of the second frequency band (e.g., 0-54 MHz or 0-108 MHz) may also be used to add a low frequency signal that is added to the RF data signal to be amplified such that positive or negative peak output values produced by the power amplifier are reduced. For example, if a large positive output peak needs to be produced to accommodate a particular RF data signal, a low frequency signal having a negative value may be summed with the RF data signal to thereby reduce the amplitude of the high peak that needs to be output by the amplifier.

Similarly for large negative peaks such a low frequency signal would preferably have a positive value such that the negative peak to be output by the amplifier may be reduced. The change rate of the low frequency signal may be limited such that for positive and negative peaks in rapid succession the low frequency signal may be added to set to a compromise. Using this concept a low frequency waveform may be constructed such that peak values (positive or negative) may be reduced. An example waveform is shown in FIG. 9.

Figure 9:
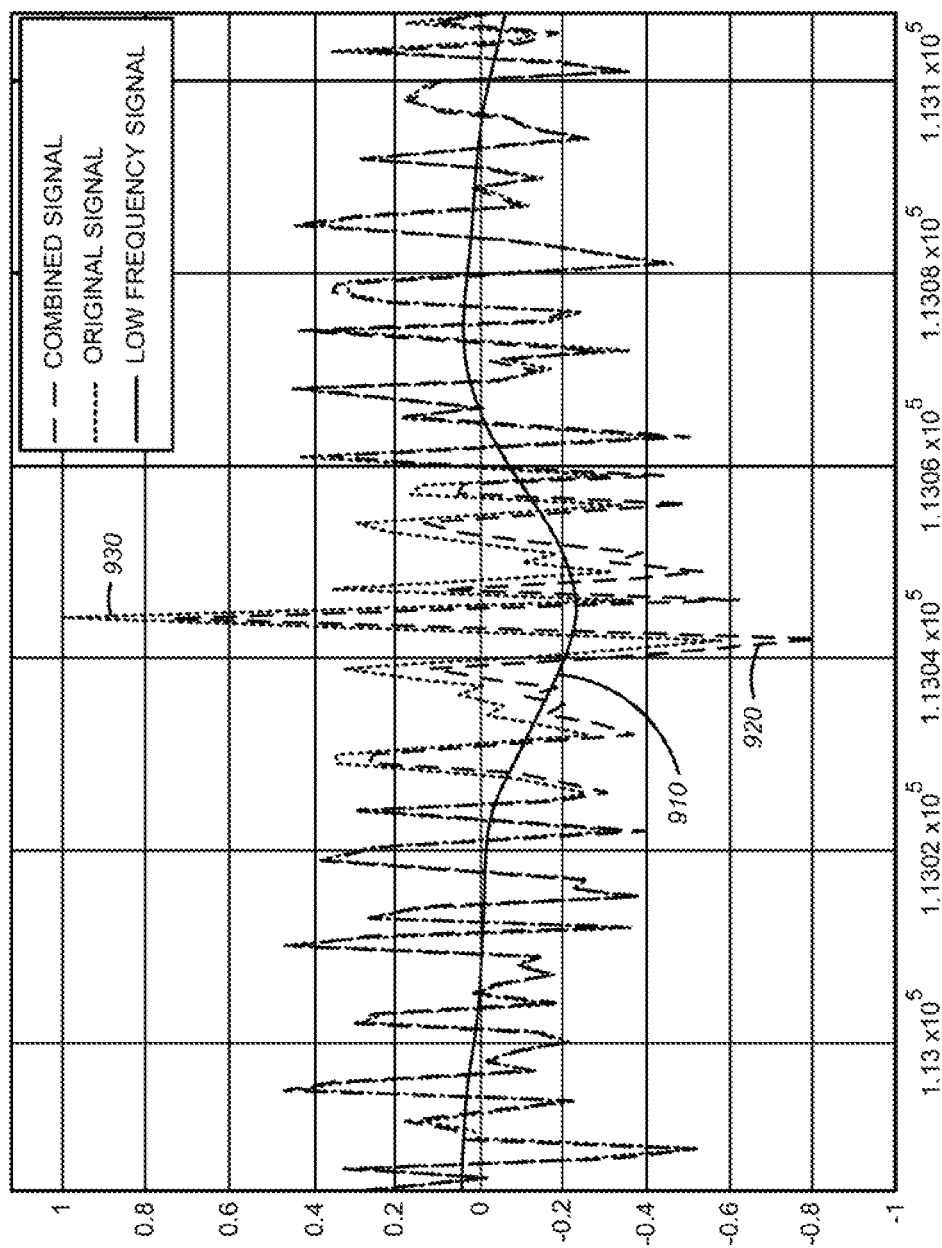
FIG. 9 is a waveform diagram of an example RF signal waveform with low frequency signal and combined waveform output.

FIG. 9 is a waveform diagram of an example RF signal waveform with low frequency signal and combined waveform output.

In the example of FIG. 9, the RF signal (930) has a peak with an amplitude, for example of 1, that may be closely followed by a negative peak with, for example, value −0.6. The low frequency signal (910) has a value of (−) 0.2 such that the positive and negative peaks are reduced in magnitude to 0.8. As a result, amplifier bias (whether voltage or current) to output a combined signal 920 with peak values limited to 0.8 may be reduced to 0.8 compared to 1 for signals with peak values reaching 1. As a result, an approximate 20% reduction in current and voltage results in an approximate 40% reduction in power in this example. However, in practice when simulating with, for example, a flat multi-QAM CATV signal, the power savings may be on the order of approximately 20%. Of course, the low frequency signal passes through the amplifier and is output by the amplifier. For example, in most CATV systems, the low frequency band is used for upstream signals, and, at the output of the node, a diplexer (not shown) may be used to separate upstream and downstream signals. As a result, a low frequency signal output by the power amplifier may generally not be output by a node. However, diplex filters have finite suppression and adding a significant amount of low frequency output power from the power amplifier may result in interference with upstream signals. As a result, additional filtering may be added to reduce the low frequency signal at the output of the amplifier.

Figure 11:
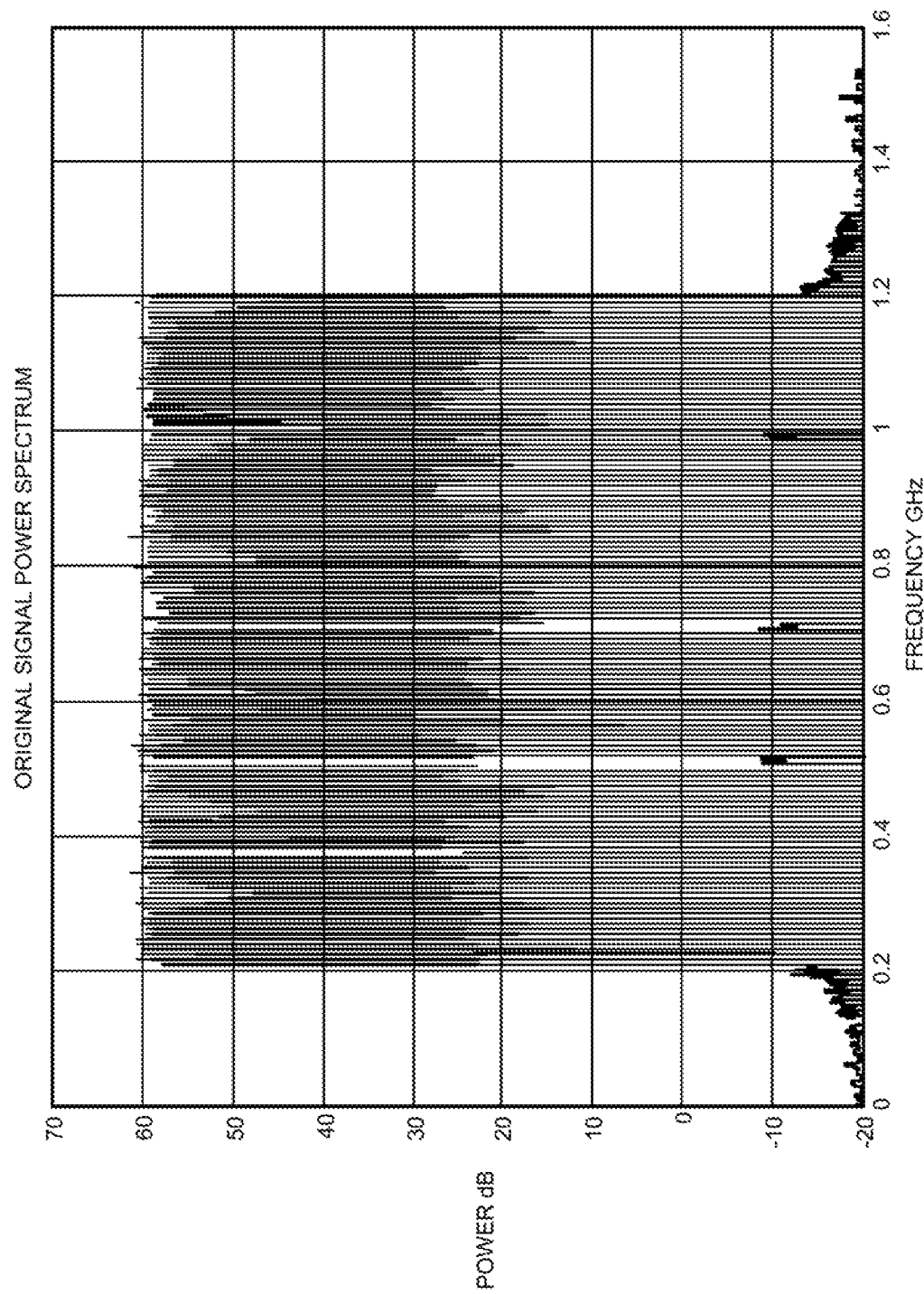
FIG. 11 is a signal diagram of an example CATV RF forward signal in 200-1200 MHz band without a low frequency offset signal added.
Figure 12:
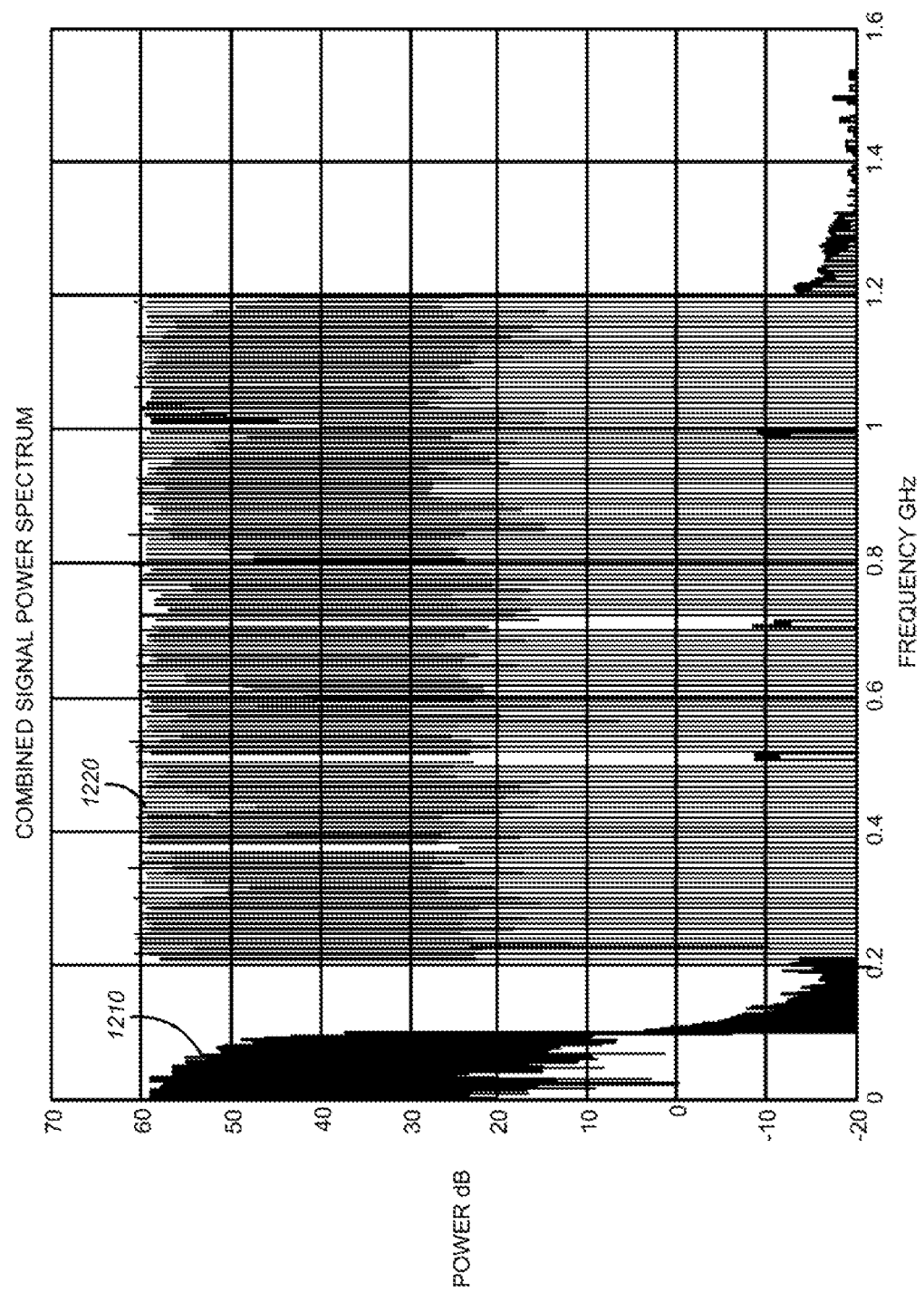
FIG. 12 is a signal diagram of an example CATV RF forward signal with low frequency offset signal added.

Furthermore, input and output transformers and feedback capacitors in forward band RF amplifiers are typically not designed to support frequencies significantly below the CATV forward RF signal band. Therefore, amplifier modifications may be made to the amplifier to ensure proper addition of the low frequency signal to the amplifier. The low frequency signal may be limited in bandwidth such that it may be separated from the intended RF forward signal by an RF filter. In the example of FIG. 9, the example given spectra without and with the low frequency signal are shown in FIGS. 11 and 12 respectively. A system for implementing the concept illustrated in FIG. 9 will now be described with reference to FIG. 10.

Figure 10:
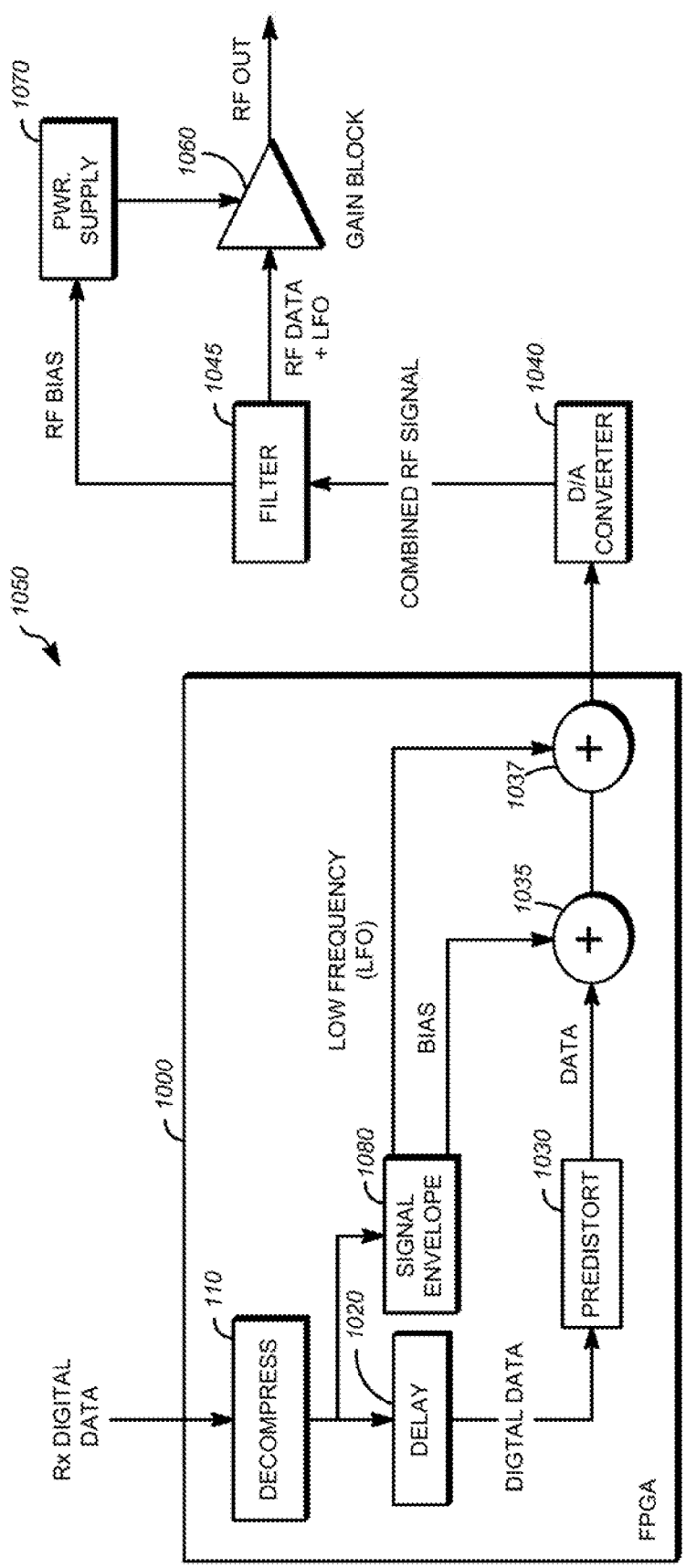
FIG. 10 illustrates an example of an amplifier system that adds a low frequency signal with a high frequency signal to be amplified.

FIG. 10 illustrates an example of an amplifier system that adds a low frequency signal with a high frequency signal to be amplified. The amplifier system 1050 includes a number of components and elements that are similar to those of the amplifier system described in FIG. 5. For example, the amplifier system 1050 includes a single DAC 1040, a filter stage 1045, a power supply 1070 and a gain block 1060. The receiver 1000 also includes elements similar to those of receiver 500, such as a delay 1020 and an optional predistortion block 1030. Since some operations of the circuits and components within the receiver 1000 are substantially the same as those of receiver 500, a detailed description of those circuits and components will not be repeated.

In order to generate a digital low frequency data peak reduction signal, a signal envelope 1080 detection circuit may generate an amplifier bias signal as described above with reference to FIG. 5, and may also generate a low frequency offset (LFO) signal that is based on the known amplifier response limits to a predetermined input signal. For example, the boundaries at which an amplifier will begin "clipping" the output signals are known. The LFO signal may be generated based on these know amplifier boundaries and an analysis of the digital data signal within the receiver 1000. As a result, a digital representation of the LFO offset signal may be generated. Similar to the amplifier system 550 of FIG. 5, the amplifier system 1050 may output from the receiver 1000, a digital data signal and a digital bias signal that are combined at the combiner 1035. The output of the combiner 1035 may couple to another combiner 1037 that also receives the LFO signal from another output of the receiver 1000. The combiner 1037 combines the LFO signal with the combined digital signal incorporating the digital bias signal and the digital data signal. The output of the combiner 1037 is a digital signal including the digital bias signal, the digital LFO signal and the digital data signal, which is input to the DAC 1040. The DAC 1040, for example, produces a modified combined analog RF signal. The modified, combined RF signal includes in addition to the analog radio frequency (RF) data signal in the first frequency band (e.g., 54-1200 MHz or 108-1200 MHz) and the analog RF amplifier bias control signal in the second frequency band (e.g., 0-54 MHz or 0-108 MHz), an analog low frequency data peak reduction signal (e.g., LFO signal) in the second frequency band of the modified, combined RF signal. The modified, combined is applied to the filter 1045 that passes the RF bias control signal to the power supply 1070. The low frequency data peak reduction signal in the second frequency band is summed with the filtered RF data signal in the first frequency band. The low frequency data peak reduction signal in the second frequency band that is summed with the filtered RF data signal in the first frequency band is applied to the signal input terminal of the gain block 1060 of the RF amplifier 1050. As a result, the amplifier 1050 may have reduced peak excursions of the overall data signal in the RF amplifier as supported by the signal diagrams of FIG. 9 and signal spectra of FIGS. 10 and 11 that illustrate spectra without and with an LFO signal respectively for the case that the LFO signal uses the 0-108 MHz signal band and an ET bias control signal is not used. The ET or LFO signals may be used alone or in a combination such that their spectra do not overlap.

FIG. 11 is a signal diagram of an example CATV RF forward signal in 200-1200 MHz band without the low frequency signal added, and FIG. 12 is a signal diagram of an example RF forward signal with low frequency signal added.

In FIG. 11, the example CATV RF forward signal in 200-1200 MHz band has an approximate maximum power of 60 dB. As shown in FIG. 12, the added low frequency signal 1210 is limited to about 108 MHz (shown in the left side of FIG. 12) and does not interfere with an RF forward signal 1220 above 108 MHz, such as above 200 MHz in the example shown from FIGS. 11 and 12. By adding a low frequency signal in the forward RF path of a CATV downstream amplifier, the amount of bias required for output power amplifiers such that the power dissipation may be reduced for a given RF output power requirement may be reduced. In some example, the low frequency signal may be generated to obtain an improved best compromise between positive and negative peak values in the combined RF data signals and low frequency (i.e., second frequency band) signals. The signal bandwidth of the second frequency band signal may be limited to frequencies less than the forward CATV signal band.

Aspects of the methods of the exemplary apparatus and method outlined above may be embodied in programming, e.g. in the form of software, firmware, or microcode executable by a user computer system, a server computer or other programmable device. Program aspects of the technology may be thought of as "products" or "articles of manufacture" typically in the form of executable code and/or associated data that is carried on or embodied in a type of machine readable medium. "Storage" type media include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to one or more of "non-transitory," "tangible" or "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-transitory storage media include, for example, optical or magnetic disks, such as any of the storage devices in any computer(s) or the like. It may also include storage media such as dynamic memory, for example, the main memory of a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and light-based data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

Program instructions may comprise a software or firmware implementation encoded in any desired language. Programming instructions, when embodied in machine readable medium accessible to a processor of a computer system or device, render computer system or device into a special-purpose machine that is customized to perform the operations specified in the program.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical or similar elements in the process, method, article, or apparatus that comprises the element.

The term "coupled" as used herein refers to any logical, physical or electrical connection, link or the like by which signals produced by one system element are imparted to another "coupled" element. Unless described otherwise, coupled elements or devices are not necessarily directly connected to one another and may be separated by intermediate components, elements or communication media that may modify, manipulate or carry the signals. Each of the various couplings may be considered a separate communications channel.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A method, comprising:
    receiving a combined digital signal at a digital-to-analog converter (DAC), the combined digital signal including at least a digital amplifier bias control signal and a digital data signal;
    producing, by the DAC, from the combined digital signal a combined analog RF signal comprising an analog radio frequency (RF) data signal in a first frequency band and an analog RF amplifier bias control signal in a second frequency band, wherein the first frequency band is a higher frequency band than the second frequency band and the first and second frequency bands are mutually exclusive;
    outputting the combined analog RF signal to a filter; and
    filtering, by the filter, the combined analog RF signal to output the analog RF data signal, the RF data signal being configured to be applied to a signal input terminal of an RF amplifier and to output the analog RF amplifier bias control signal, the analog RF amplifier bias control signal being configured to be applied to a bias control input terminal of the RF amplifier.

2. The method of claim 1, further comprising:
    dynamically adjusting an overall amplifier bias of the RF amplifier according to the RF amplifier bias control signal, wherein the overall amplifier bias tracks an envelope of the RF data signal in the high radio frequency band.

3. The method of claim 1, wherein the combined digital signal further comprises:
    a digital low frequency data peak reduction signal.

4. The method of claim 3, further comprising:
    producing by the DAC a modified combined analog RF signal comprising in addition to the analog RF data signal in the first frequency band and the analog RF amplifier bias control signal in the second frequency band, an analog low frequency data peak reduction signal in the second frequency band of the modified, combined RF signal; and
    combining the analog low frequency data peak reduction signal in the second frequency band with the filtered analog RF data signal in the first frequency band, wherein the low frequency data peak reduction signal in the second frequency band with the filtered analog RF data signal in the first frequency band are configured to, when applied to the signal input terminal of an RF amplifier, reduce peak excursions of the overall data signal provided by the RF amplifier.

5. The method of claim 1, further comprising:
    delaying the digital data signal; and
    applying digital predistortion to the delayed digital data signal to reduce amplifier distortion by the RF amplifier.

6. The method of claim 1, further comprising:
    delaying the digital data signal; and
    applying digital predistortion and compensation for dynamic bias induced distortion to the delayed digital data signal.

7. The method of claim 1, wherein the first radio frequency band is approximately 54-1200 MHz and the second radio frequency band is approximately 0-54 MHz.

8. The method of claim 1, wherein the first radio frequency band is approximately 108-1200 MHz and the first radio frequency band is approximately 0-108 MHz.

9. A cable television system node, comprising:
    a pre-amplifier stage including at least one filter, the pre-amplifier stage configured to:
        receive a combined signal including a radio frequency (RF) data signal and an RF bias control signal,
        filter the combined signal to separate the RF data signal from the RF bias control signal; and
        amplify the RF data signal to produce an amplified RF data signal; and
    a plurality of power amplifiers coupled to the preamplifier stage, each of the power amplifiers configured to receive the amplified RF data signal at a signal input terminal and the RF bias control signal at a bias input terminal, wherein each of the power amplifiers is configured to:
        in response to the bias control signal being applied to a bias control input of the power amplifier, dynamically adjust an overall bias of the power amplifier while amplifying the received RF data signal.

10. The node of claim 9, wherein the RF data signal is in a first frequency band of approximately 54-1200 MHz and the RF bias control signal is in a second frequency band of approximately 0-54 MHz.

11. The node of claim 10, wherein the first frequency band includes a guard band of approximately 500 kHz to 5 MHz and the second frequency band includes a guard band of approximately 500 kHz to 5 MHz.

12. The node of claim 9, wherein the first frequency is approximately 108-1200 MHz and the second frequency band is approximately 0-108 MHz.

13. The node of claim 12, wherein the first frequency band includes a guard band of approximately 500 kHz to 5 MHz, and the second frequency band includes a guard band of approximately 500 kHz to 5 MHz.

14. The node of claim 9, wherein the at least one RF filter is a diplex filter that removes the RF bias control signal from the combined RF signal.

15. The node of claim 9, further comprises:
    a predistortion module configured to introduce a predistortion to a data signal portion of the combined signal to compensate for amplifier distortion of the RF data signal.

16. The node of claim 15, wherein the predistortion module further configured to:
    introduce a dynamic bias compensation for dynamic bias induced distortion of the RF data signal.

17. An amplification system, comprising:
    a digital to analog converter, the digital to analog converter coupled to:

receive a combined digital signal from the digital data processing stage, the combined digital signal including a digital data signal and a digital amplifier bias control signal, and output a combined radio frequency (RF) signal that is an analog representation of the combined digital signal; and a filter stage coupled to the digital to analog converter, the filter stage configured to:

filter the combined RF signal to separate an analog RF data signal and an analog amplifier bias control signal from the analog combined RF signal.

18. The amplification system of claim 17, further comprising:

at least one power amplifier coupled to the filter, wherein each of the at least one power amplifier has an amplifier bias control input terminal, a data signal input terminal, and at least one output terminal, wherein the filter stage outputs the RF data signal to the signal input terminal of the at least one power amplifier and outputs the amplifier bias control signal to the amplifier bias control input terminal of the at least one power amplifier.

19. The amplification system of claim 17, further comprising:

a source for receiving or generating a digital data signal;

a signal envelope determination module coupled to the source, the signal envelope determination module configured to generate a digital amplifier bias control signal representing an envelope of the digital data;

a delay element coupled to the source, the delay element configured to delay the digital data signal to compensate for processing performed by the signal envelope determination module; and a combiner, coupled to the delay element and the signal envelope determination module, configured to combine the digital data signal and the digital amplifier bias control signal.

20. The amplification system of claim 19, further comprising:

a digital predistortion module coupled the delay element and the combiner, the digital predistortion module configured to predistort the digital data to compensate for distortion introduced by the at least one power amplifier.

21. The amplification system of claim 19, further comprising:

a decompression element coupled to the source, and configured to:

decompress digital data obtained from the source that has been compressed; and output the decompressed digital data to the delay element and the signal envelope determination module.

22. A method, comprising:

receiving a combined digital signal at a digital-to-analog converter (DAC), the combined digital signal including at least a digital amplifier bias control signal and a digital data signal;

producing by the DAC a modified combined analog RF signal comprising in addition to the analog RF data signal in the first frequency band and the analog RF amplifier bias control signal in the second frequency band, an analog low frequency data peak reduction signal in the second frequency band of the modified, combined RF signal;

combining the analog low frequency data peak reduction signal in the second frequency band with the filtered analog RF data signal in the first frequency band, wherein the low frequency data peak reduction signal in the second frequency band with the filtered analog RF data signal in the first frequency band are configured to, when applied to the signal input terminal of an RF amplifier, reduce peak excursions of the overall data signal provided by the RF amplifier; and outputting the combined analog RF signal to a filter.

* * * * *